US010096359B2

(12) United States Patent
Yoshimoto et al.

(10) Patent No.: US 10,096,359 B2
(45) Date of Patent: Oct. 9, 2018

(54) NONVOLATILE MEMORY DEVICE HAVING RESISTIVE MEMORY CELLS INCLUDING AT LEAST ONE RESISTIVE MEMORY CELL INITIAL STATE

(71) Applicant: Panasonic Intellectual Property Management Co., Ltd., Osaka (JP)

(72) Inventors: Yuhei Yoshimoto, Osaka (JP); Yoshikazu Katoh, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 6 days.

(21) Appl. No.: 15/594,927

(22) Filed: May 15, 2017

(65) Prior Publication Data

US 2017/0345490 A1    Nov. 30, 2017

(30) Foreign Application Priority Data

May 27, 2016   (JP) .................... 2016-106829

(51) Int. Cl.
| | | |
|---|---|---|
| *G11C 11/00* | (2006.01) | |
| *G11C 11/56* | (2006.01) | |
| *G11C 16/26* | (2006.01) | |
| *G11C 13/00* | (2006.01) | |

(Continued)

(52) U.S. Cl.
CPC ........ *G11C 11/5642* (2013.01); *G11C 13/004* (2013.01); *G11C 16/26* (2013.01);
(Continued)

(58) Field of Classification Search
CPC ... G11C 11/5642; G11C 13/004; G11C 16/26; G11C 2013/0042; G11C 2013/0054; G11C 7/06; G11C 7/14
(Continued)

(56) References Cited

U.S. PATENT DOCUMENTS

2011/0110144 A1*   5/2011   Kawai ................. G11C 11/5685
                                                          365/148
2012/0300532 A1    11/2012   Yamazaki et al.
(Continued)

FOREIGN PATENT DOCUMENTS

| JP | 2008-066438 | 3/2008 |
| JP | 2012-243372 | 12/2012 |

(Continued)

OTHER PUBLICATIONS

Sanu K. Mathew et al., "A 0.19pJ/b PVT-Variation-Tolerant Hybrid Physically Unclonable Function Circuit for 100% Stable Secure Key Generation in 22nm CMOS", ISSCC2014, Feb. 11, 2014.
(Continued)

*Primary Examiner* — Tha-O H Bui
(74) *Attorney, Agent, or Firm* — McDermott Will & Emery LLP

(57) ABSTRACT

A nonvolatile memory device includes: resistive memory cells each of which takes either a variable state or an initial state, the resistive memory cells including at least one resistive memory cell in the initial state; and a read circuit that includes a resistance detection circuit that obtains resistance value information of the at least one resistive memory cell, and a data generation circuit that generates digital data corresponding to the resistance value information. The resistance detection circuit applies a second read voltage to the at least one resistive memory cell to obtain the resistance value information. The second read voltage is larger than a first read voltage and smaller than a voltage of a forming pulse that is an electrical stress for changing from the initial state to the variable state. The first read voltage is for reading a resistive memory cell in the variable state.

13 Claims, 16 Drawing Sheets

(51) Int. Cl.
 *G11C 7/14* (2006.01)
 *G11C 7/06* (2006.01)
(52) U.S. Cl.
 CPC .................. *G11C 7/06* (2013.01); *G11C 7/14* (2013.01); *G11C 2013/0042* (2013.01); *G11C 2013/0054* (2013.01)
(58) Field of Classification Search
 USPC ........................................................ 365/148
 See application file for complete search history.

(56) References Cited

U.S. PATENT DOCUMENTS

2012/0326113 A1* 12/2012 Yoneda .............. G11C 13/0007 257/4

| | | |
|---|---|---|
| 2013/0129083 A1 | 5/2013 | Fujino |
| 2013/0194886 A1 | 8/2013 | Schrijen et al. |
| 2015/0213890 A1 | 7/2015 | Katoh |
| 2015/0220457 A1 | 8/2015 | Katoh et al. |

FOREIGN PATENT DOCUMENTS

| | | |
|---|---|---|
| JP | 2013-545340 | 12/2013 |
| WO | 2012/014291 | 2/2012 |
| WO | 2014/119327 | 8/2014 |
| WO | 2014/132662 | 9/2014 |

OTHER PUBLICATIONS

An Chen, "Comprehensive Assessment of RRAM-based PUF for Hardware Security Applications", IEDM 2015, Dec. 7, 2015.

\* cited by examiner

NONVOLATILE MEMORY DEVICE HAVING RESISTIVE MEMORY CELLS INCLUDING AT LEAST ONE RESISTIVE MEMORY CELL INITIAL STATE

BACKGROUND

1. Technical Field

The present disclosure relates to a nonvolatile memory device, and in particular, relates to a nonvolatile memory device including a plurality of nonvolatile resistive memory cells.

2. Description of the Related Art

Internet-of-Things (IoT) technology with which various items are connected to each other by means of Internet communication is beginning to spread. Communication is carried out frequently between various devices. Examples of such devices include not only products that are familiar to consumers such as traffic-related integrated circuit (IC) cards and smartphone terminals but also sensors and vehicle-mounted engine control units (ECUs). Under such circumstances, a higher level of security technology is constantly in demand in mutual authentication and the encryption of communication data in communications.

With regards to software technology, encryption technology for program processing centered on advanced encryption algorithms has accumulated, and sufficient security has been achieved. However, with technological progress, there is a rapidly increasing concern regarding information within circuits being directly read from outside.

International Publication No. 2012/014291 proposes a countermeasure for this kind of concern. Generally, in an IC having enhanced security, information leaks are prevented by encrypting confidential information using an encryption circuit mounted therein. In this case, it is essential that information regarding an encryption key (also referred to as a "private key") that is retained internally is not leaked to the outside.

In recent years, in order to solve these issues, various technologies to enhance the security of ICs have been proposed (Japanese Unexamined Patent Application Publication (Translation of PCT Application) No. 2013-545340, International Publication No. 2014/119327, "A 0.19pJ/b PVT-Variation-Tolerant Hybrid Physically Unclonable Function Circuit for 100% Stable Secure Key Generation in 22 nm CMOS" Sanu K. Mathew, et al. ISSCC2014, and "Comprehensive Assessment of RRAM (Registered Trademark)-based PUF for Hardware Security Applications" An Chen, IEDM2015).

SUMMARY

One non-limiting and exemplary embodiment provides a nonvolatile memory device having improved reliability.

In one general aspect, the techniques disclosed here feature a nonvolatile memory device comprising: resistive memory cells each of which takes either a variable state or an initial state, the resistive memory cells including at least one resistive memory cell in the initial state; and a read circuit. The read circuit comprises: a resistance detection circuit that obtains resistance value information of the at least one resistive memory cell; and a data generation circuit that generates digital data corresponding to the resistance value information. The resistance detection circuit applies a second read voltage to the at least one resistive memory cell to obtain the resistance value information. The second read voltage is larger than a first read voltage and smaller than a voltage of a forming pulse that is an electrical stress for changing from the initial state to the variable state. The first read voltage is for reading a resistive memory cell in the variable state.

The nonvolatile memory device according to an aspect of the present disclosure is able to improve reliability.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

Figure 1:
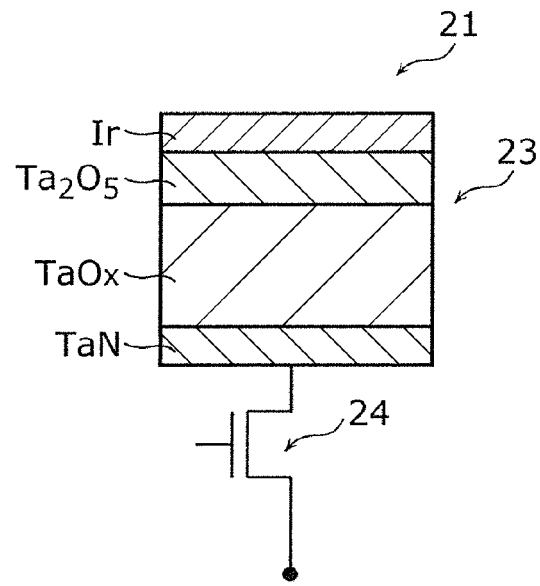
FIG. 1 is a diagram depicting a configuration of a resistive memory cell (e.g. ReRAM memory cell)

DETAILED DESCRIPTION (Findings Forming the Basis for the Present Disclosure)

Physically unclonable function (PUF) technology and forming hidden data (FHD) technology have been proposed in recent years. PUF technology is a technology that uses manufacturing variations to generate unique individual identification information that is different for each IC. Hereinafter, in the present specification, individual identification information generated by means of PUF technology will be referred to as "PUF data". PUF data can be said to be random number data that is associated with variations in the physical characteristics of ICs and that is unique to each device. These physical characteristics cannot be artificially controlled for each IC, and it is therefore possible to generate data that cannot be physically replicated.

SRAM PUFs such as those of the following can be cited as specific prior examples: Japanese Unexamined Patent Application Publication (Translation of PCT Application) No. 2013-545340; and "A 0.19pJ/b PVT-Variation-Tolerant Hybrid Physically Unclonable Function Circuit for 100% Stable Secure Key Generation in 22 nm CMOS" Sanu K. Mathew, et al. ISSCC2014. In these examples, a phenomenon is used in which whether digital data having an initial value from when power is supplied is liable to enter a 1 state or a 0 state differs depending mainly on variations in a threshold voltage Vt (in other words, variations in an operating voltage) of a transistor in each memory cell in an SRAM. Whether a 1 state is liable to be entered or a 0 state is liable to be entered is unique to each memory cell, and the initial value data of SRAMs is different from each other. That is, the initial value data from when power is supplied to an SRAM is used as PUF data.

In addition, a ReRAM PUF such as that of the following can be cited as an example: "Comprehensive Assessment of RRAM (Registered Trademark)-based PUF for Hardware Security Applications" An Chen, IEDM2015. This example is a method in which the resistance variations of each memory cell of a ReRAM are used, two memory cells in the same state are selected, and digital ID data is generated from the magnitude relationship between the resistance values of both memory cells. Resistance variations in the same resistance state are randomly different for each IC, and therefore these resistance variations are used as digital ID data.

In this way, according to PUF technology, PUF data that becomes a random number that is unique to each IC is generated as data that cannot be replicated. This PUF data is used as a device key for encrypting the aforementioned private key. The private key encrypted by means of the device key (that is, the PUF data) is saved in a nonvolatile memory in an encrypted state. In other words, the encrypted private key recorded in the nonvolatile memory can be decrypted into the original private key data only with the device key. Thus, even if all of the data within the nonvolatile memory is hard-copied due to hacking, the device key (namely, the PUF data) that is unique to each IC cannot be replicated, and therefore the encrypted private key is not returned to the original state and cannot be used.

Meanwhile, FHD technology is a data recording technology in which the physical characteristics of a ReRAM such as that given in International Publication No. 2014/119327 are used. Hereinafter, in the present specification, information recorded by means of FHD technology will be referred to as "FHD data". A ReRAM memory cell is made to transition to a variable state in which a rewrite that becomes ordinary recording data is possible, by way of a process referred to as forming in which a voltage stress that is larger than an ordinary rewrite voltage is applied to thereby cause dielectric breakdown, in an initial state that is an insulation state in which the resistance value is extremely high. However, FHD data is a technology in which, rather than treating a rewrite in the variable state as recording data, the initial state from prior to applying forming stress and the variable state are mixed and treated as recording data. A determination threshold value for FHD data is different from that for ordinary recording data, and therefore reading cannot be performed with a determination threshold value for ordinary recording data, and reading is possible with only a determination threshold value for FHD data that has been set from a special command. Thus, FHD data cannot be stolen by unauthorized access from the user side. Consequently, it becomes possible for FHD data to be treated as hidden data.

As previously mentioned, PUF and FHD technology are important technologies for increasing the security of ICs. Nevertheless, reliability with which it is possible to read data that is stable in various environments, and area saving are required in addition to conventional security.

An aspect of the present disclosure provides a nonvolatile memory device that is capable of achieving even greater reliability and area saving while maintaining security.

Here, before describing an embodiment, findings that were discovered by experimentation will be described in association with the principles of ReRAM. It should be noted that the following explanation is an example of data for understanding the present disclosure, and does not restrict the present disclosure.

The inventors of the present application carried out an experiment using a memory cell array configured of what are referred to as 1T1R memory cells, and acquired experimental data. The 1T1R memory cells are resistive memory cells (hereinafter, also simply referred to as "memory cells") in which an oxygen-deficient Ta oxide (TaOx) is used, and each memory cell is configured of one transistor and one resistance-variable element.

Figure 2:
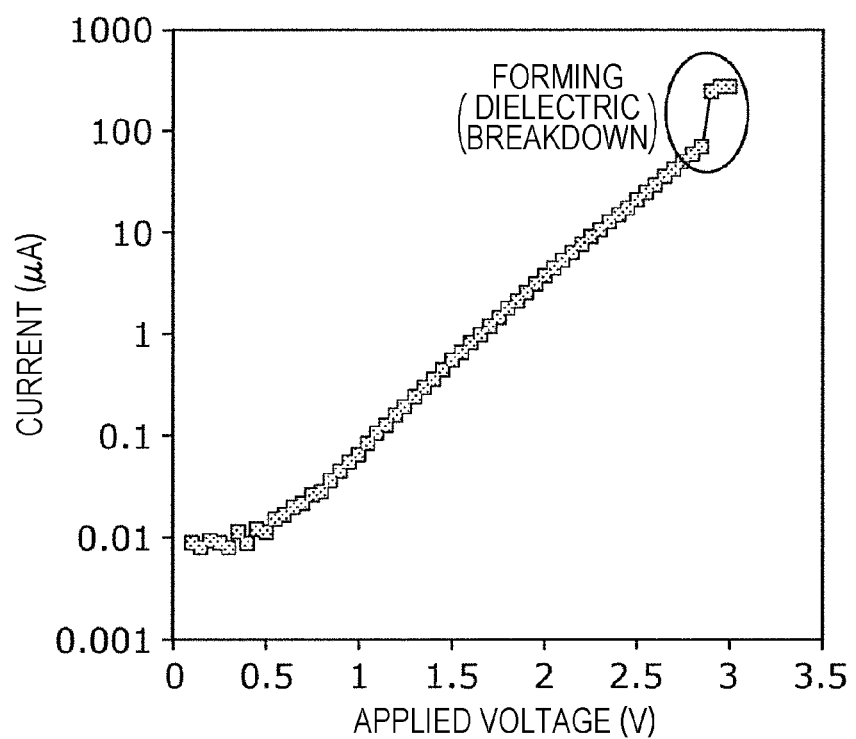
FIG. 2 is a graph depicting voltage-current characteristics of a memory cell in an initial state.

FIG. 1 is a diagram depicting a configuration of a resistive memory cell (ReRAM memory cell) 21. The memory cell 21 is configured of one transistor 24 and one resistance-variable element 23 connected in series. For the resistance-variable element 23, the element size is approximately 400 nm×400 nm, the material of a lower electrode is TaN, the thickness of the lower electrode is approximately 50 nm, the material of an upper electrode is Ir, and the thickness of the upper electrode is approximately 100 nm, for example. The materials and thicknesses of resistance-variable layers of the resistance-variable element 23 are TaOx of approximately 650 nm and $Ta_2O_5$ of approximately 5 nm. FIG. 2 is a graph (a square symbol plot) of voltage-current characteristics depicting current that flows in the case where an applied voltage is increased from 0 V to 3 V at 0.1 V intervals with respect to 1 bit of a ReRAM memory cell in an initial state. The initial state of a ReRAM memory cell immediately after manufacturing is an insulation state having an extremely high resistance. When the applied voltage is increased in this initial state, the cell current increases in a linear manner with respect to a logarithmic axis indicating current values. When the cell current reaches a high voltage in the vicinity of 2.8 V to 3.0 V, a phenomenon referred to as forming occurs in which, in the initial state, dielectric breakdown occurs in part of the element.

Figure 3:
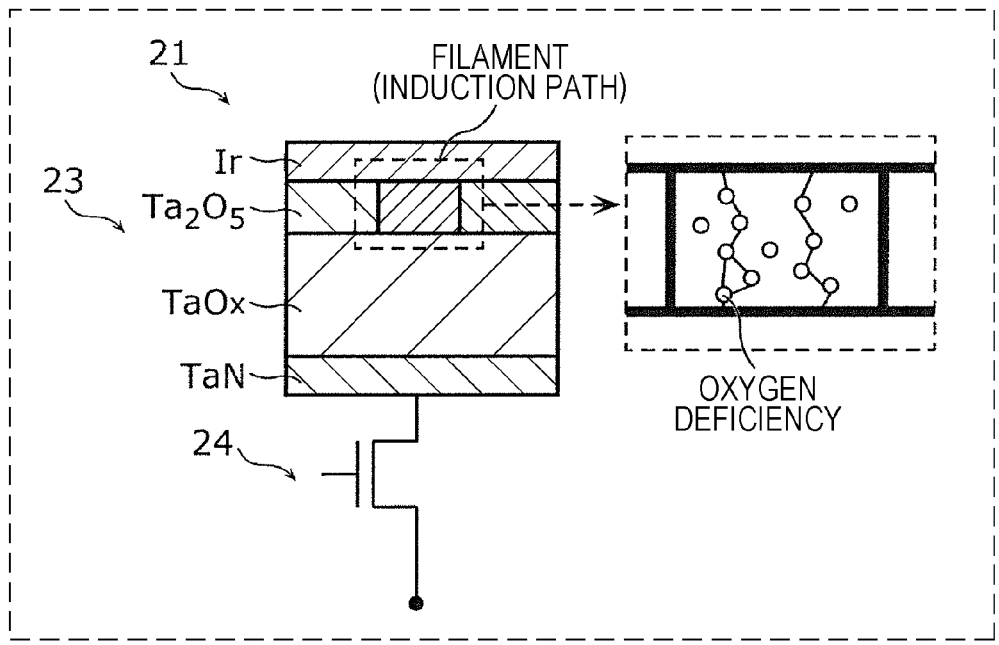
FIG. 3 is a schematic diagram depicting a configuration of a memory cell subjected to forming by means of dielectric breakdown.

As depicted in FIG. 3, in the memory cell 21 which has been subjected to forming by means of dielectric breakdown, an electrically conductive path referred to as a filament is formed in a portion of the $Ta_2O_5$. The mechanism of this filament will be described. By applying a high voltage to the memory cell 21, some of the oxygen ions within the $Ta_2O_5$ escape, and oxygen deficiency occurs. This oxygen deficiency that occurs is randomly arranged within the $Ta_2O_5$ and forms a series in a probabilistic manner, and thereby appears as an electrically conductive path. As a result, the memory cell 21 is set to a resistance value that is lower than that in the initial state. The memory cell 21 in which dielectric breakdown has occurred once due to forming is not able to return to a resistance value of the initial state level. However, by applying different positive/negative voltage pulses, it is possible to adjust the amount of oxygen deficiency present in the $Ta_2O_5$ that has occurred due to forming. Thus, by applying different positive/negative voltage pulses, it is possible to switch between the two resistance states of a high resistance state and a low resistance state. Switching can be realized using this variable state. These two states can be maintained even if the power source is cut, and it is therefore possible to use the memory cell 21 as a nonvolatile memory.

Figure 4:
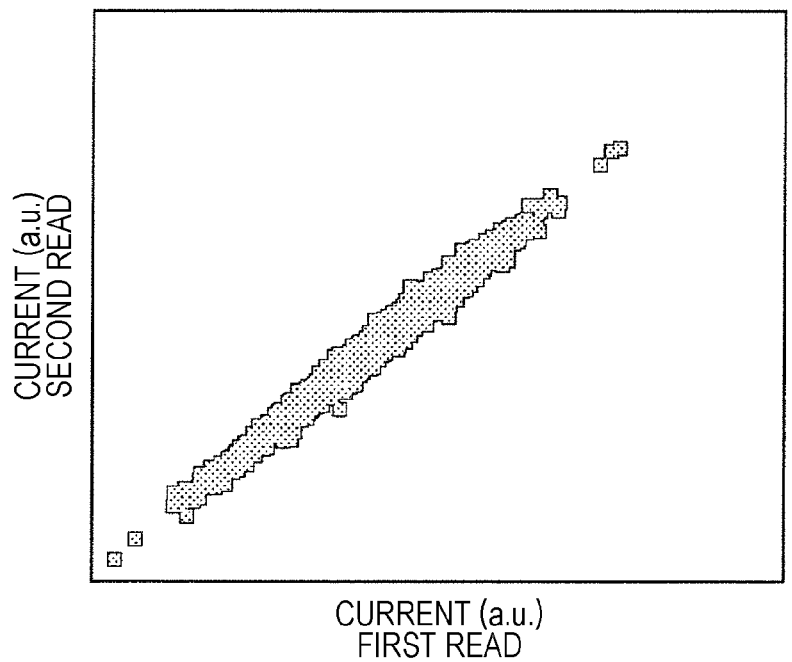
FIG. 4 is a diagram depicting a relationship between current values at the time of a first read and current values at the time of a second read in a 1-kilobit memory cell in the initial state.
Figure 5:
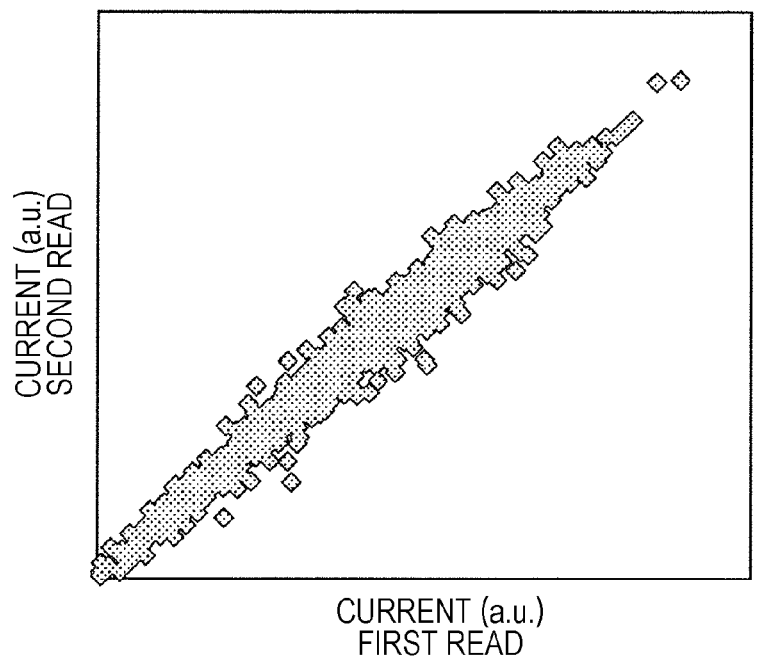
FIG. 5 is a diagram depicting a relationship between current values at the time of a first read and current values at the time of a second read in a 1-kilobit memory cell in a variable state.

Next, the difference between the characteristics of the initial state and the variable state will be described. FIG. 4 is a diagram in which the horizontal axis indicates current values at the time of a first read and the vertical axis indicates current values of a memory cell at the time of a second read with respect to a 1-kilobit memory cell in the initial state, and the relationship between these current values is depicted using a square symbol plot. FIG. 5 is a diagram in which the horizontal axis indicates current values at the time of a first read and the vertical axis indicates current values at the time of a second read with respect to a 1-kilobit memory cell in the variable state, and the relationship between these current values is depicted using a diamond symbol plot. When comparing these diagrams, it can be confirmed that, in the variable state, the amount of fluctuation in the current values of the memory cells between the first read and the second read is large compared to the initial state. The reason for this is thought to be due to the mechanism described below. More specifically, the oxygen deficiency present within the filament formed in the variable state moves as time elapses, and it is therefore thought that the electrically conductive path formed from the oxygen deficiency series also changes slightly. This is observed as fluctuation in the current values. Meanwhile, the initial state is a state in which the filament has not formed, and is a state in which the oxygen deficiency is mostly not present in the $Ta_2O_5$. Thus, the current values are extremely stable with the fluctuation being small.

Figure 6:
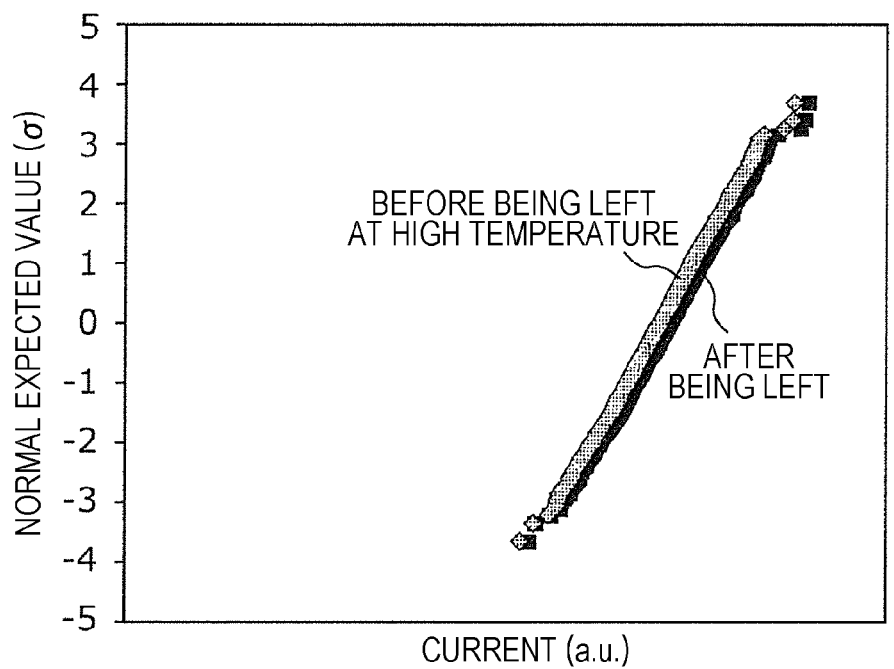
FIG. 6 is a graph that compares cell current distributions in a 4-kilobit memory cell in the initial state, before and after being left at high temperature.

In addition, the stability of resistance values in the initial state can be indicated also with FIG. 6. FIG. 6 is a graph that compares cell current distributions in a 4-kilobit memory cell in the initial state, before and after being left at high temperature, when having carried out an accelerated deterioration test by leaving at high temperature for four hours at 175° C. In FIG. 6, the horizontal axis indicates current values of the memory cell, the vertical axis indicates a cumulative probability σ distribution, the cell current distribution before being left at high temperature is plotted using gray diamond symbols, and the cell current distribution after being left is plotted using black square symbols. As is clear also from this diagram, it can be confirmed that the initial state is an extremely stable resistance state in which mostly no deterioration in resistance values is seen.

The following two findings regarding a memory cell in the initial state obtained by the inventors of the present application were obtained from the aforementioned experimental data.

The cell current of a memory cell in the initial state has log-linear properties with respect to voltage up to a forming voltage.

A resistance-variable element in the initial state has little fluctuation and deterioration over time, and is stable and highly reliable compared to a resistance-variable element in the variable state.

If the aforementioned findings are utilized, it is thought that it is possible to carry out development into applied technology such as the following, and to realize solutions to the problems, for example.

(1) Development for PUF Technology

In "Comprehensive Assessment of RRAM (Registered Trademark)-based PUF for Hardware Security Applications" An Chen, IEDM2015, variations in resistance values in the variable state were used, and therefore there was considerable deterioration over time and there was a problem with the reproducibility of stable PUF data.

Figure 7:
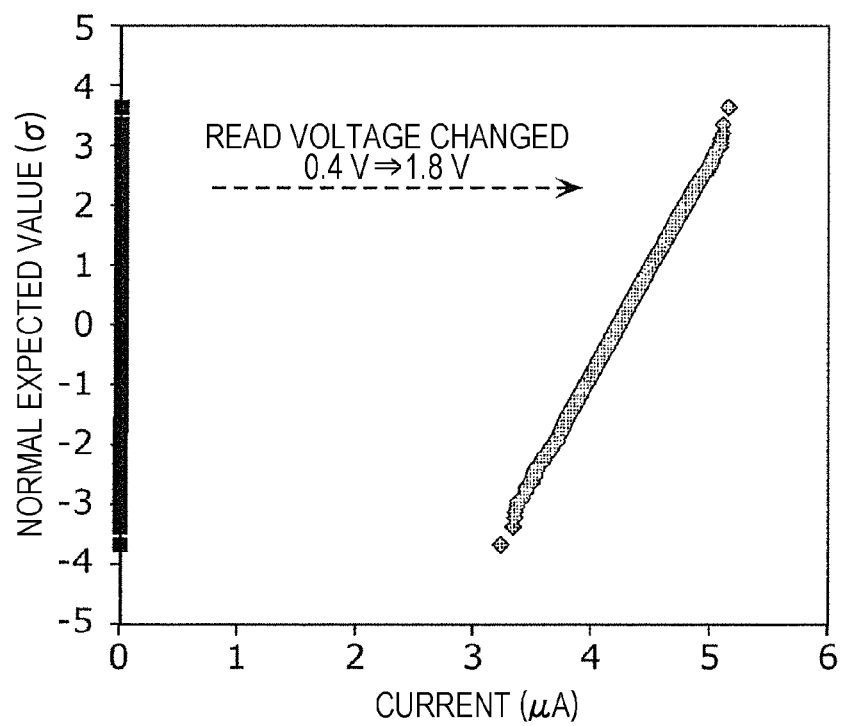
FIG. 7 is a diagram depicting resistance variation distribution characteristics when reading is performed with read voltages of 0.4 V and 1.8 V with respect to a 4-kilobit memory cell.

Hence, the inventors of the present application applied the features of the initial state. FIG. 7 depicts resistance variation distribution characteristics in the case where reading is performed at an ordinary read voltage of 0.4 V and in the case where reading is performed with the read voltage boosted to 1.8 V with respect to a 4-kilobit memory cell. In FIG. 7, the horizontal axis indicates current, the vertical axis indicates a cumulative probability σ distribution, the case of the ordinary read voltage of 0.4 V is plotted using black square symbols, and the case of the read voltage of 1.8 V is plotted using gray diamond symbols. At an ordinary read voltage, the current value was extremely small, and it was difficult for the resistance variation distribution of the initial state to be detected by a circuit. By boosting the read voltage, the resistance variation distribution of the initial state was amplified up to a cell current level that could be detected by a circuit, and application in PUF technology in which the initial state is used thereby became possible. Thus, stable PUF data can be generated and an improvement in reproducibility can be realized.

(2) Problem Solving for FHD Technology

In International Publication No. 2014/119327, a determination threshold value for FHD data that distinguishes between the initial state and a first resistance state of the variable state is set, and FHD data is recorded in the initial state and the first resistance state. This determination threshold value for FHD data is different from a determination threshold value for ordinary recording data that distinguishes between the first resistance state and a second resistance state in the variable state of a resistance-variable element of a ReRAM. Thus, security is improved. However, the inventors of the present application noticed the following point when proceeding to investigate FHD technology. More specifically, when in a high-temperature environment (for example, 125° C.), the leakage current of the transistors of peripheral circuits increases. Thus, with a determination threshold value for FHD data that determines extremely small current differences, the current value (approximately 1 uA) of the determination threshold value is exceeded by the leakage current (1 to 1.5 uA). Therefore, it becomes difficult to read FHD data using a circuit used by ordinary recording data.

Figure 8:
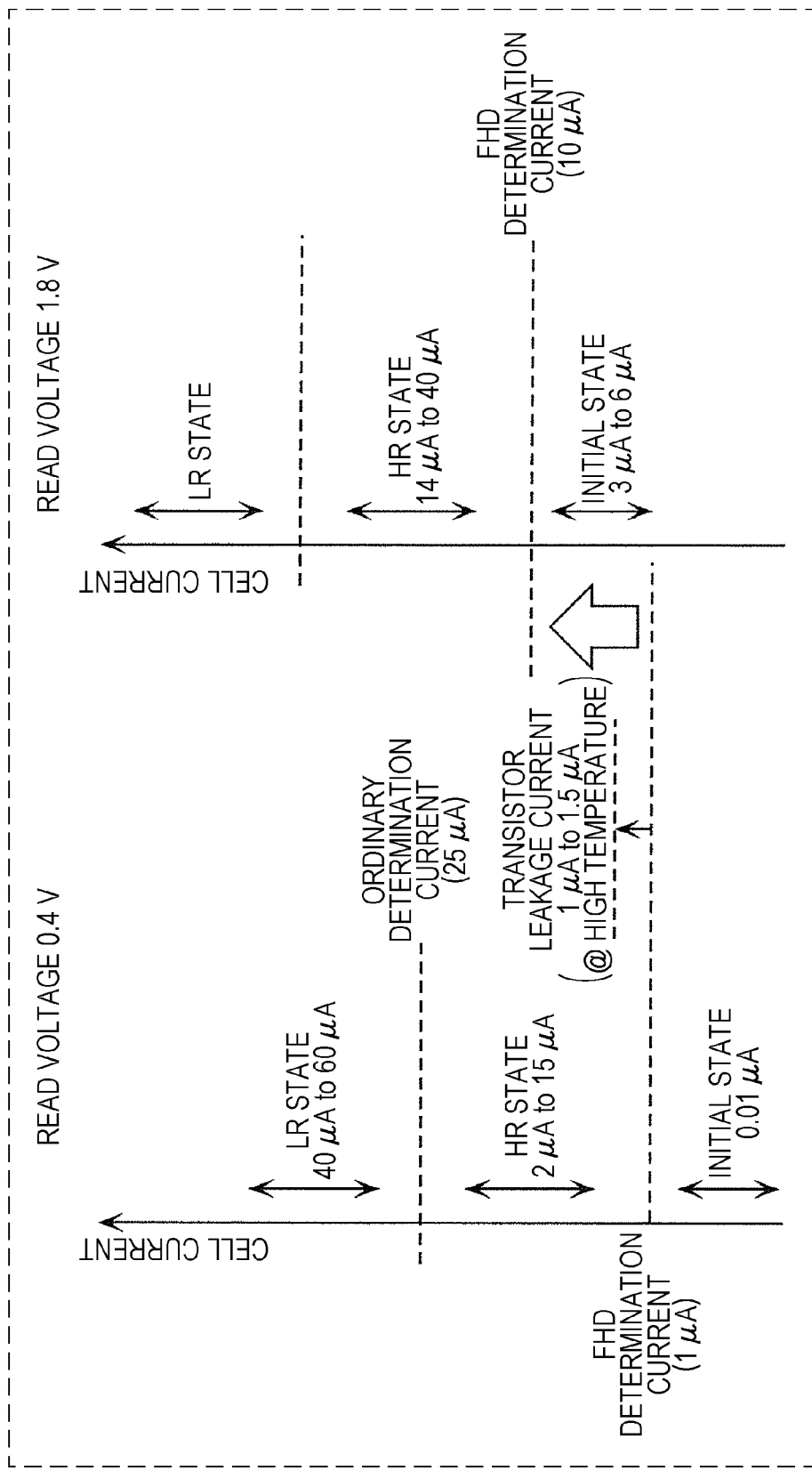
FIG. 8 is a diagram depicting cell current distributions when a memory cell is read with read voltages of 0.4 V and 1.8 V.

Hence, the present inventors turned their attention to the aforementioned features of the initial state. As depicted in FIG. 8, by reading FHD data with a voltage that is larger than an ordinary read voltage, the absolute value of the current in the initial state and the first resistance state can be increased. FIG. 8 is a diagram depicting cell current distributions when a memory cell is read at read voltages of 0.4 V and 1.8 V, in each state (initial state, HR state, and LR state) of the memory cell. By reading FHD data with a voltage that is larger than the ordinary read voltage, the determination threshold value can be set higher than the leakage current value of a transistor, even in a high-temperature environment. Thus, it becomes possible to realize the reading of FHD data with a conventional circuit.

Furthermore, in implementing the aforementioned (1) PUF and (2) FHD, it becomes possible for a large number of circuit elements for generating PUF data and FHD data to be made common with circuits mounted as an ordinary nonvolatile memory device. Therefore, the circuit scale, which increases for the generation of digital ID data, can be significantly suppressed and miniaturized (that is, area can be saved) to a high degree.

On the basis of the findings of the inventors of the present application, an overview of an aspect of the present disclosure is as follows.

A nonvolatile memory device according to an aspect of the present disclosure comprises: a plurality of resistive memory cells each of which takes either a variable state or an initial state; and a read circuit. The plurality of resistive memory includes a memory group including at least one resistive memory cell in the initial state. The read circuit comprises: a resistance detection circuit that obtains resistance value information of the plurality of memory cells; and a data generation circuit that generates digital data corresponding to the resistance value information obtained by the resistance detection circuit. The resistance detection circuit comprises a voltage application circuit that selectively applies a first read voltage for reading a resistive memory cell in the variable state, and a second read voltage that is larger than the first read voltage and smaller than a voltage of a forming pulse that is an electrical stress for changing from the initial state to the variable state. When the resistance detection circuit obtains resistance value information of the at least one resistive memory cell of the memory group, the voltage application circuit applies the second read voltage to the at least one resistive memory cell of the memory group.

The plurality of resistive memory cells include the memory group as a second memory group. The plurality of resistive memory cells may further include a first memory group including a plurality of resistive memory cells in the variable state. The read circuit may further comprise a voltage setting circuit that, when the resistance detection circuit obtains the resistance value information of the at least one resistive memory cell of the second memory group, sets a voltage that is applied to the at least one resistive memory cell of the second memory group by the voltage application circuit to be the second read voltage, and when the resistance detection circuit obtains resistance value information of the plurality of resistive memory cells of the first memory group, sets a voltage that is applied to the plurality of resistive memory cells of the first memory group by the voltage application circuit to be the first read voltage. In each of the plurality of resistive memory cells in the variable state, a resistance value reversibly transitions between a plurality of variable resistance value ranges when voltage pulses of different polarities is applied. In each of the at least one resistive memory cell in the initial state, a resistance value is in an initial resistance value range that does not overlap with the variable resistance value ranges.

Thus, the second read voltage, which is larger than the first read voltage, is applied to the second memory group that includes the at least one resistive memory cell in the initial state. Therefore, variations in the resistance value of the resistive memory cell in the initial state are obtained. Variations in resistance values in the initial state cannot be written in an arbitrary manner, and exhibit little fluctuation in current values. Thus, variations in resistance values in the initial state are an extremely stable information source for PUF data. In addition, it becomes possible for a circuit serving as an information source for PUF data to be made common as a circuit that is mounted as an ordinary nonvolatile memory device. Thus, a nonvolatile memory device capable of achieving even greater reliability and area saving while maintaining security is realized. It should be noted that one or more resistive memory cells in the variable state may also be included in the second memory group. The second read voltage may be applied also when reading the one or more resistive memory cells in the variable state of the second memory group.

Here, the at least one resistive memory cell of the memory group may include a plurality of resistive memory cells in the initial state. The data generation circuit may generate first security data by mutually comparing resistance value information of the plurality of resistive memory cells included in the memory group. The nonvolatile memory device may further comprise a determination value generation circuit that generates a determination value by using resistance value information of the plurality of resistive memory cells of the memory group. The data generation circuit may use the determination value to generate first security data corresponding to the resistance value information of the at least one resistive memory cell of the memory group. The determination value may be a binarization reference value.

Thus, the first security data that may be PUF data is generated by comparing the resistance value information of the resistive memory cells included in the memory group. Therefore, a threshold value to generate the first security data may be determined depending on the nonvolatile memory device, and a high degree of security is maintained.

Furthermore, the at least one resistive memory cell in the initial state may be half or more of all resistive memory cells included in the memory group. Thus, resistive memory cells in the initial state that account for half or more of the memory group can be used as an information source for the first security data that may be PUF data.

Furthermore, the variable state may include a first resistance state and a second resistance state having a higher resistance value than that of the first resistance state, and a resistance value in the initial state may be higher than the resistance value in the second resistance state.

Thus, the initial state having a resistance value that is higher than that of the variable state is used as an information source for the first security data that may be PUF data.

Furthermore, data may be recorded in the first memory group by using the first resistance state and the second resistance state are used, and second security data may be recorded in the second memory group by using the variable state and the initial state.

Thus, the second security data that may be FHD data for which the variable state and the initial state are used is recorded in the second memory group. Thus, recording and reproduction by means of FHD data may be carried out with the variable state and the initial state being mixed. In reproduction, it is necessary to use a threshold value that is different from a threshold value for the variable state, and therefore data is concealed with a high degree of security being maintained.

Furthermore, first security data may be recorded in the second memory group. Thus, the first security data that may be PUF data and the second security data that may be FHD data are recorded in the second memory group. Therefore, a nonvolatile memory device that is an information source having a high degree of randomness (in other words, an information source for PUF data), and that is capable of concealing data (in other words, recording FHD data) with a high degree of security being maintained is realized.

Furthermore, third security data encrypted using the first security data may be recorded in the second memory group. Thus, since third security data that is encrypted using first security data is recorded in the second memory group, a private key encrypted with PUF data as a key can be recorded in the second memory group as FHD data, for example. Thus, data recording having an extremely high degree of security for which PUF data and FHD data are both used is realized.

Further, each of the at least one resistive memory may not change a state from the initial state to the variable state unless the forming pulse is applied.

A nonvolatile memory device according to another aspect of the present disclosure comprises: a plurality of resistive memory cells each of which takes either a variable state or an initial state; and a read circuit. The plurality of resistive memory cells includes at least one resistive memory cell in the initial state. The read circuit comprises: a resistance detection circuit that obtains resistance value information of the at least one resistive memory cell in the initial state; and a data generation circuit that generates digital data corresponding to the resistance value information obtained by the resistance detection circuit. The resistance detection circuit applies a second read voltage to the at least one resistive memory cell in the initial state to obtain the resistance value information. The second read voltage is larger than a first read voltage and smaller than a voltage of a forming pulse that is an electrical stress for changing from the initial state to the variable state. The first read voltage is for reading a resistive memory cell in the variable state.

Hereinafter, the details of the present disclosure will be described with reference to the appended diagrams. The embodiment described hereinafter represents one specific example. The numerical values, the shapes, the materials, the constituent elements, the arrangement positions and modes of connection of the constituent elements, the steps, the order of the steps, and the like given in the following embodiment are merely examples and do not restrict the present disclosure. From among the constituent elements in the following embodiment, constituent elements that are not mentioned in the independent claims indicating the most significant concepts of the present disclosure are described as optional constituent elements. Furthermore, in the diagrams, configurations that are the same or similar are denoted by the same reference numerals. Explanations are may be omitted for configurations denoted by the same reference numerals. Furthermore, to aid understanding of the diagrams, the constituent elements therein are depicted in a schematic manner, and therefore shapes, dimension ratios, and the like may not be accurately depicted. Furthermore, in the manufacturing method, the order and the like of each process can be changed, and other publicly-known processes can be added, as required.

Embodiment (Overview of a Variable-Resistance Nonvolatile Memory Device Used in the Present Disclosure)

Figure 9:
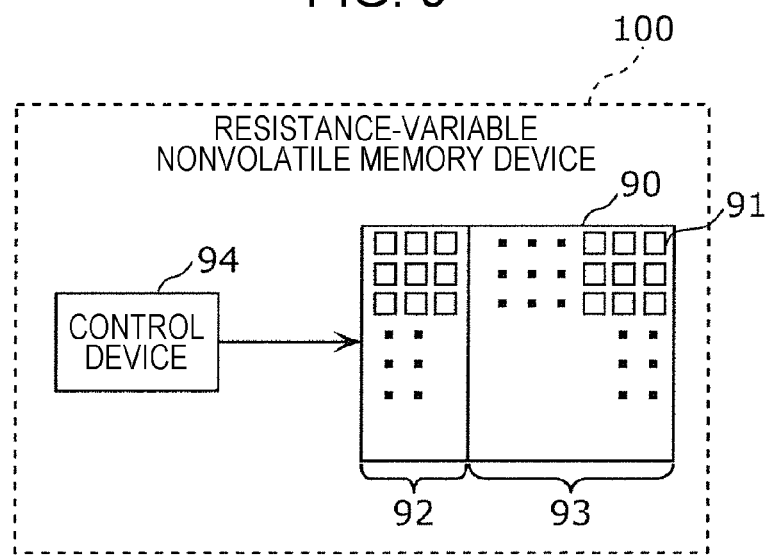
FIG. 9 is a block diagram depicting an example of a schematic configuration of a nonvolatile resistive memory device according to an embodiment.
Figure 10:
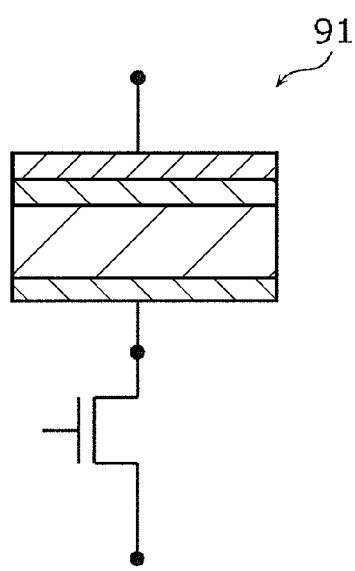
FIG. 10 is a cross-sectional diagram depicting an example of a schematic configuration of a memory cell provided in the nonvolatile resistive memory device according to the embodiment.

FIG. 9 is a block diagram depicting an example of a schematic configuration of a nonvolatile resistive memory device 100 according to an embodiment. Furthermore, FIG. 10 is a cross-sectional diagram depicting an example of a schematic configuration of a memory cell 91 provided in the nonvolatile resistive memory device 100 according to the embodiment. It should be noted that a nonvolatile resistive memory device is an example of a nonvolatile memory device. In the present embodiment, a nonvolatile resistive memory device is also referred to as a nonvolatile memory device, a nonvolatile resistive memory, or a nonvolatile memory.

In the example depicted in FIG. 9, the nonvolatile resistive memory device 100 of the present embodiment is provided with at least a memory cell array 90. The nonvolatile memory device 100 may, in addition, be provided with a control device 94. It should be noted that it is not always necessary for the control device 94 to be part of the nonvolatile memory device 100, and a control device connected outside of the nonvolatile memory device 100 may be used for the operation described hereinafter to be carried out.

The memory cell array 90 has a configuration in which a plurality of memory cells 91 are arranged in an array form. The interior of the memory cell array 90 is classified into a memory α region 92, which is an example of the second memory group, and a memory β region 93, which is an example of the first memory group.

The control device 94 switches a setting for a read voltage applied to the memory cells 91, in accordance with whether the memory cell 91 being accessed belongs to the memory α region 92 or belongs to the memory β region 93. The read voltage for the memory α region 92 is set to be a higher voltage than the read voltage for the memory β region 93.

Figure 11:
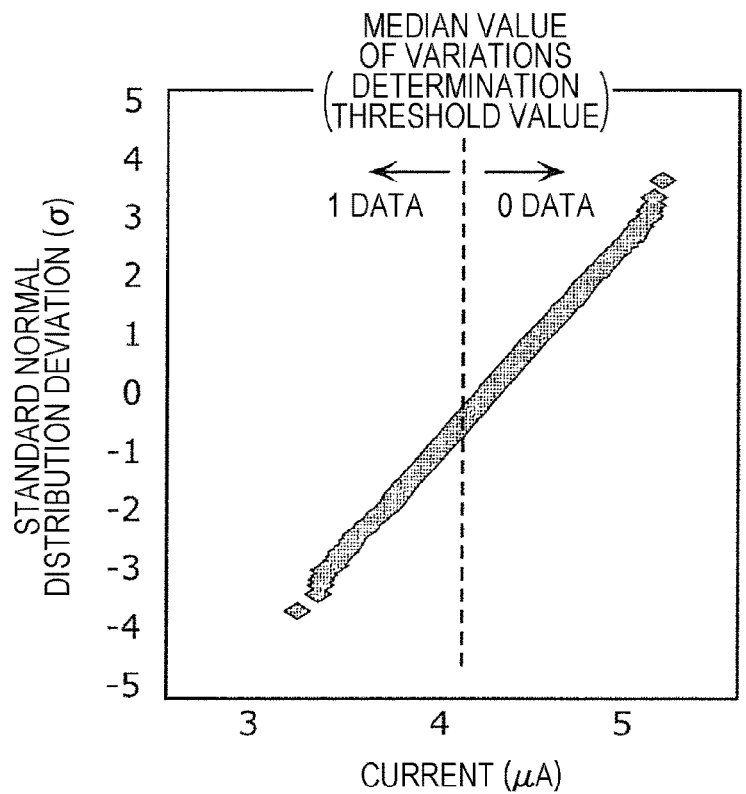
FIG. 11 is a diagram depicting a distribution of resistance value information acquired from a plurality of memory cells having a resistance value range in the initial state.

In the case where the memory α region 92 of the nonvolatile memory device 100 is used as individual identification information for PUF data to be generated, a plurality of nonvolatile memory cells in which each resistance value belongs to the same resistance value range of the initial state are used. The control device 94 acquires resistance value information from the plurality of memory cells having the same resistance value range of the initial state, and calculates a median value. FIG. 11 is a diagram depicting a distribution of resistance value information acquired from the plurality of memory cells having the resistance value range of the initial state. The distribution of resistance value information is depicted using a diamond symbol plot. The calculated median value is set as a binarized determination threshold value (an example of a determination value), as depicted in FIG. 11. PUF data is generated by using this binarized determination threshold value to determine which value from among the digital data of 0 or 1 is to be assigned to the plurality of memory cells in the same initial state. The "initial state" here refers to a state in which the resistance value is in an initial resistance value range that does not overlap with a variable resistance value range. A memory cell in the initial state does not enter the variable state unless forming is carried out. "Forming" refers to a predetermined electrical stress being applied to a memory cell and the memory cell being made to change to a state in which the resistance value of the memory cell reversibly transitions between a plurality of variable resistance value ranges.

The electrical stress (in other words, the forming stress) applied for forming may be an electrical pulse having a predetermined voltage and time span, for example. Furthermore, the forming stress may be a combination of a plurality of electrical pulses. Furthermore, the forming stress may be a cumulative stress. In such a case, the memory cells 91 (see FIG. 10) transition from the initial state to the variable state when the cumulative amount of stress exceeds a predetermined amount.

The plurality of memory cells 91 have a property such that, after manufacturing, if forming is not performed, they do not enter a state in which the resistance value reversibly transitions between the plurality of variable resistance value ranges. That is, after having been manufactured by a semiconductor process or the like, a resistance-variable element prior to the forming stress being applied is described as being in the initial state. The resistance variations of the memory cells 91 in this initial state have a random property in accordance with the normal distribution. A bit that has transitioned to the variable state due to a forming stress being applied once can never again be written back to the resistance value level of the initial state. Based on the above, within the resistance value range of this initial state, binary data cannot be deliberately written to an arbitrary address. In other words, user data cannot be written to the plurality of nonvolatile memory cells. That is, resistance variations in the initial state serve as an information source for PUF data of the nonvolatile memory device 100.

The memory α region 92 of the nonvolatile memory device 100 is used as secret hidden information. In the case where FHD data is to be generated, data is recorded using the resistance value range of the initial state and the resistance value range of the high resistance side (HR state) of the variable state.

The details of the aforementioned "resistance value range" will be described in detail with reference to FIG. 12.

The memory cells 91 transition to the variable state when the forming stress is applied in the aforementioned initial state. The memory cells 91 have the property of being able to enter the variable state of reversibly transitioning between the first resistance value range and the second resistance value range, due to a plurality of different electrical signals being applied. That is, the memory cells 91 have the property of being able to enter: a variable state in which resistance values reversibly transition between the plurality of variable resistance value ranges due to voltage pulses having different polarities being applied; and an initial state in which the variable state is not entered unless a forming pulse that is an electrical stress for changing to the variable state is applied, and in which resistance values are in the initial resistance value range that does not overlap with the variable resistance value ranges.

Figure 12:
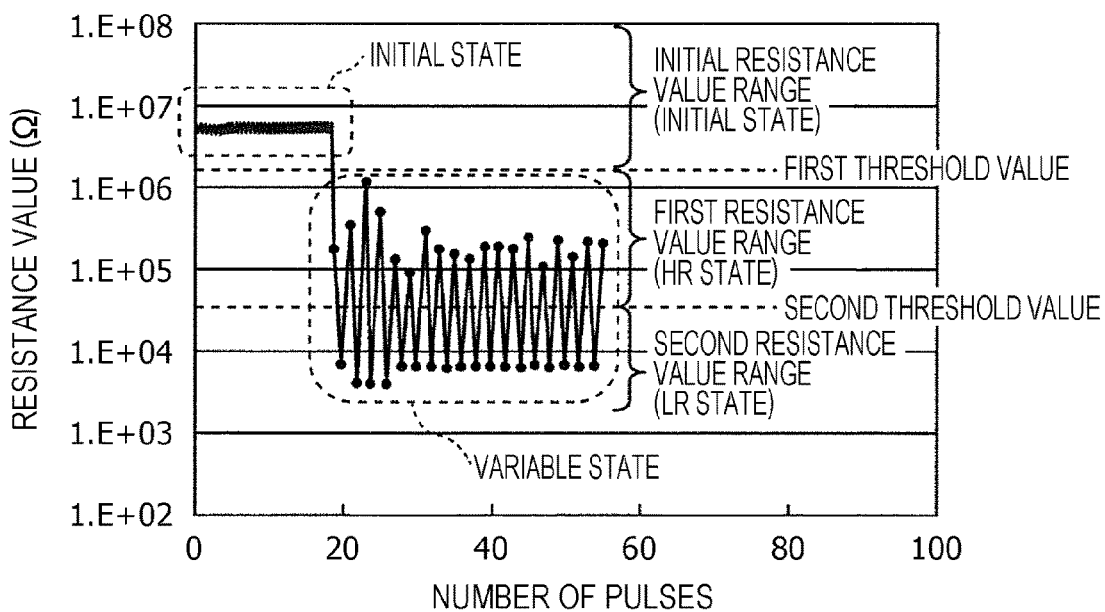
FIG. 12 is a graph depicting an example of the resistance value ranges of the memory cells provided in the nonvolatile resistive memory device according to the embodiment.

FIG. 12 is a graph depicting an example of the resistance value ranges of the memory cells provided in the nonvolatile resistive memory device according to the embodiment. As exemplified in FIG. 12, with FHD data, data is recorded using the difference in resistance between a first resistance value range (the resistance value range of the HR state in the variable state) and the initial resistance value range (the resistance value range in the initial state).

"Resistance value information" is information having a correlation with a resistance value, and may be the resistance value itself or may be a value that increases/decreases in accordance with the resistance value. The value that increases/decreases in accordance with the resistance value may be a discharge time, such as that described later on, in which charge accumulated in a capacitor connected in parallel to the memory cells is discharged by way of a selected memory cell. The value that increases/decreases in accordance with the resistance value may, conversely, be a charge time in which the discharged capacitor is supplied with a predetermined constant current and charged up to a predetermined level. The discharge time or the charge time may be a count value or the like that is counted in a predetermined clock period. It should be noted that the capacitor is not restricted to being an element, and may be parasitic capacitance of wiring, for example.

The resistance value information may be a value that is measured by a sense amplifier of a predetermined resolution. Alternatively, the resistance value information may be a value obtained by determining whether a value measured by the sense amplifier corresponds to any of the plurality of resistance value ranges divided by the threshold values. In such a case, each of the plurality of resistance value ranges may be more finely divided. Furthermore, only some of the plurality of resistance value ranges may be more finely divided.

Figure 13:
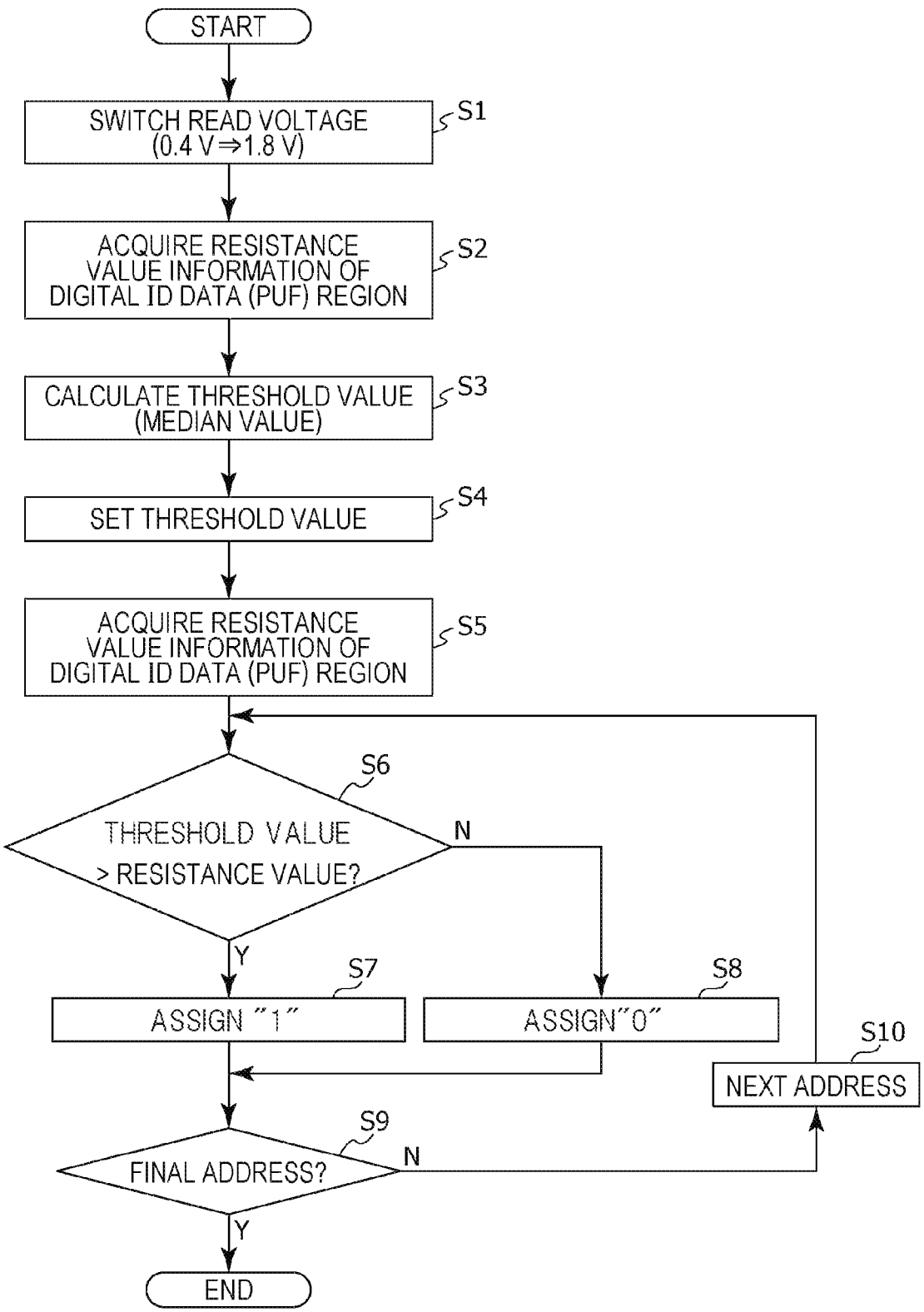
FIG. 13 is a flowchart depicting processing when registering and reproducing PUF data, using a nonvolatile resistive memory according to the embodiment.

FIG. 13 is a flowchart depicting processing when registering and reproducing PUF data, which is an example of the first security data, using a nonvolatile resistive memory according to the embodiment.

In step S1, in the case where the memory α region 92 is to be accessed, the nonvolatile memory boosts the read voltage up to 1.8 V which is higher than the 0.4 V handled in the memory β region 93. In step S2, the nonvolatile memory acquires the resistance value information of memory cells having PUF data recorded therein. In step S3, the nonvolatile memory calculates a threshold value (median value of the variation distribution) to serve as a basis for the binarization depicted in FIG. 11, on the basis of the acquired resistance value information of the PUF data. In step S4, the nonvolatile memory sets the calculated threshold value as the most up-to-date threshold value. Thereafter, in step S5, the nonvolatile memory acquires the resistance value information of the PUF data. Thereafter, in step S6, the nonvolatile memory compares each piece of resistance value information and the threshold value, and thereby, in step S7, assigns "1" to the piece of digital ID data corresponding to the piece of the resistance value information if the resistance value is smaller than the threshold value. In step S8, the nonvolatile memory assigns "0" to the piece of digital ID data corresponding to the piece of the resistance value information if the resistance value is equal to or larger than the threshold value. In step S9, the nonvolatile memory confirms that all addresses for conversion from the resistance value information to the digital ID data have been completed; if not completed, in step S10, the next address of the PUF data is selected, whereas if completed, the flow is ended. In this way, variations in the resistance values of memory cells in the initial state are used for PUF data, and the registration and reproduction of PUF data, which is an example of the first security data, are thereby carried out.

Figure 14:
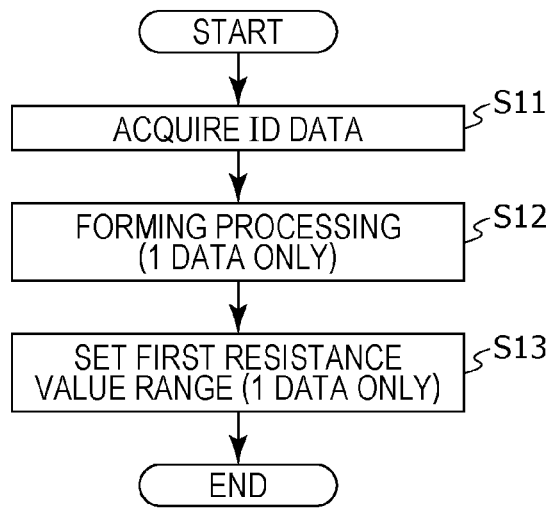
FIG. 14 is a flowchart depicting processing when registering FHD data, using the nonvolatile resistive memory according to the embodiment.
Figure 15:
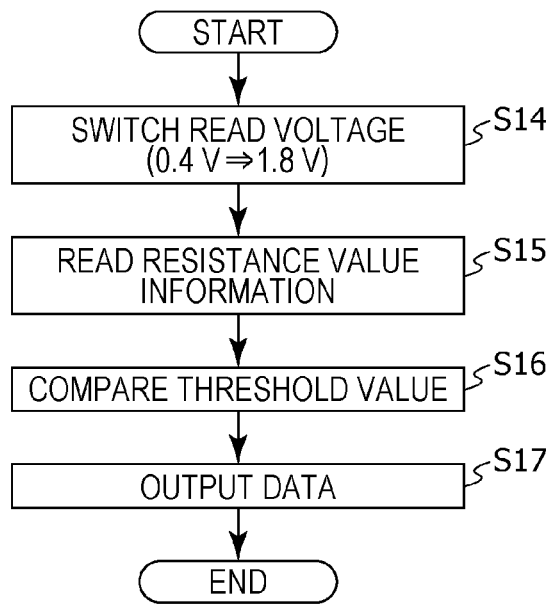
FIG. 15 is a flowchart depicting processing when reproducing FHD data, using the nonvolatile resistive memory according to the embodiment.

FIG. 14 is a flowchart depicting processing when registering FHD data, which is an example of the second security data, using a nonvolatile resistive memory according to the embodiment. FIG. 15 is a flowchart depicting processing when reproducing FHD data.

In step S11, an ID data pattern generated outside of the nonvolatile memory is input to the nonvolatile memory, or an ID data pattern is generated within the nonvolatile memory. In step S12, the nonvolatile memory executes forming processing on only data assigned to 1 from among the input data. In addition, in step S13, the nonvolatile memory executes write processing to keep resistance values within the first resistance value range (the HR state), for the memory cells subjected to forming processing. The writing and registering of FHD data is thereby completed.

Meanwhile, when FHD data is reproduced, in step S14, the nonvolatile memory sets the read voltage to be boosted up to 1.8 V, in a manner similar to the case of PUF data. Thereafter, in step S15, the nonvolatile memory reads resistance value information. In addition, in step S16, the nonvolatile memory compares a first threshold value depicted in FIG. 12 and values indicated by the resistance value information that has been read, and, from the magnitude relationships therebetween, converts the resistance value information into FHD digital ID data. Thus, in step S17, FHD data is output. In this way, the registration and reproduction of FHD data, which is an example of the second security data, are carried out by using the difference between the resistance values of memory cells in the initial state and the resistance values of memory cells in the variable state (here, the HR state).

Next, a specific configuration example for realizing the method of the present disclosure will be described.

Figure 16:
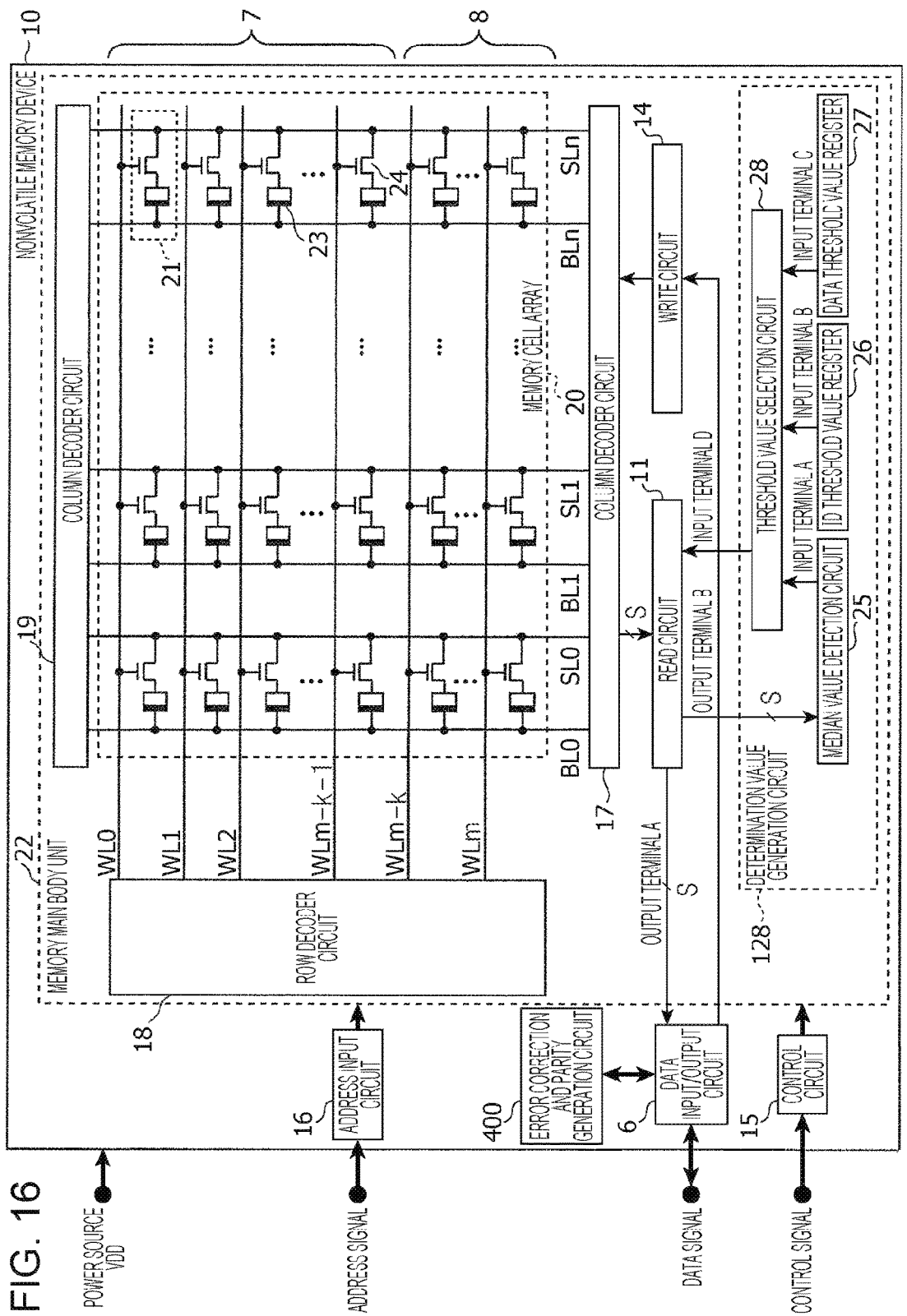
FIG. 16 is a block diagram depicting a specific configuration example of the nonvolatile memory device of the present disclosure.

FIG. 16 is a block diagram depicting a specific configuration example of a nonvolatile memory device 10 of the present disclosure. It should be noted that FIG. 16 is merely an example, and the specific configuration of the nonvolatile memory device 10 of the embodiment is not restricted to the configuration depicted in FIG. 16.

As depicted in FIG. 16, the nonvolatile memory device 10 in the embodiment is a device provided with resistive memory cells that are capable of retaining data using changes in resistance values. The nonvolatile memory device 10 is provided with a memory main body unit 22 on a semiconductor substrate. Furthermore, the nonvolatile memory device 10 is additionally provided with a data input/output circuit 6, a control circuit 15, and an address input circuit 16.

The memory main body unit 22 is provided with a read circuit 11, a write circuit 14, a column decoder circuit 17, a row decoder circuit 18, a memory cell array 20, a determination value generation circuit 128, and an error correction and parity generation circuit 400. The determination value generation circuit 128 is provided with a median value detection circuit 25, a threshold value selection circuit 28, an ID threshold value register 26, and a data threshold value register 27.

The write circuit 14 writes data by applying a predetermined voltage in each operation to a selected memory cell 21.

The read circuit 11 is a circuit that acquires the resistance value information of the memory cell 21. The read circuit 11 detects changes in the current flowing to a bit line by means of a reading method described later on, and acquires the resistance value information of the selected memory cell as a digital count value.

The row decoder circuit 18 selects one word line WL from among a plurality of m+1 number of word lines WL connected to the memory cell array 20.

The column decoder circuit 17 selects S number of bit lines BL and S number of source lines SL corresponding thereto from among n+1 number of bit lines BL and n+1 number of source lines SL, and connects the selected bit lines BL and source lines SL to the write circuit 14 and the read circuit 11. It should be noted that n is a plurality, and S is the number of parallel reads. Note that, n is greater than m, and m is greater than k+1.

The row decoder circuit 18 and the column decoder circuit 17 are capable of operating in accordance with the number of rows and/or columns for which a read and/or write is carried out in parallel.

The read circuit 11 of the nonvolatile memory device 10 has output terminals A and B and an input terminal D. The threshold value selection circuit 28 of the determination value generation circuit 128 is connected to the input terminal D.

The determination value generation circuit 128 is a circuit that provides, to the read circuit 11, a determination threshold value (an example of a determination value) to be used during reading. This determination value is a binarization reference value, for example. The determination value generation circuit 128 has a function of generating a binarization reference value from resistance value information obtained from a plurality of memory cells of the second memory group.

The threshold value selection circuit 28 has input terminals A, B, and C, the median value detection circuit 25 is connected to the input terminal A, the ID threshold value register 26 is connected to the input terminal B, and the data threshold value register 27 is connected to the input terminal C. The threshold value selection circuit 28 selects any from among these three input terminals, and outputs the determination threshold value to be used during reading, to the read circuit 11. This threshold value is used by the read circuit 11 for binarizing a signal obtained from the column decoder circuit 17, as data of 0 or 1.

The median value detection circuit 25 outputs a determination threshold value which is a median value that is required when PUF data is generated. A determination threshold value that is required when FHD data is generated is stored in the ID threshold value register 26. A determination threshold value for generating user data is stored in the data threshold value register 27 that is connected to the input terminal C.

The read circuit 11 outputs a signal obtained from the column decoder circuit 17 to the median value detection circuit 25 by way of the output terminal B. This signal is used by the median value detection circuit 25 to calculate the median value that is used when PUF data is generated.

In addition, the read circuit 11 outputs an output A of H or L by way of the output terminal A, and thereby outputs data of 0 or 1 that is user data, and data of 0 or 1 that is digital ID data.

In the case where parity data for error correction corresponding to the digital ID data is generated at the time of an inspection process, the data input/output circuit 6 receives the aforementioned digital ID data that is output from the output terminal A, and sends this to the error correction and parity generation circuit 400.

The error correction and parity generation circuit 400 calculates parity data for error correction corresponding to the digital ID data, and returns the calculation result to the data input/output circuit 6.

It should be noted that the error correction and parity generation circuit 400, functionally, can be divided into a circuit element that performs error correction and a circuit element that generates a parity. In the present embodiment, the error correction and parity generation circuit 400 is described as one circuit, but may be provided as two separate circuits such as an error correction circuit and a parity generation circuit.

The data input/output circuit 6 outputs parity data to the write circuit 14. The write circuit 14 writes the parity data to a redundant memory cell corresponding to the digital ID data. It should be noted that these forms of control are executed by way of the control circuit 15.

The operation of the median value detection circuit 25 will be described in more detail. The read circuit 11 compares digital count values of resistance value information with a threshold value that is input to the input terminal D by way of the input terminal A of the threshold value selection circuit 28, and outputs median value error signals of 1 or −1 from the output terminal B. The median value error signals that are output from the output terminal B are simultaneously output proportionate to the number of channels (s) that are read in a parallel manner. Thus, the number of the median value error signals is S. The median value error signals are input to the median value detection circuit 25.

The median value detection circuit 25 is an arithmetic circuit, and can be realized using a semiconductor integrated circuit, for example. The median value detection circuit 25 calculates a resistance median value with feedback-control in such a way that the median value error signals become smaller. The median value detection circuit 25 outputs the calculated resistance median value to the input terminal A of the threshold value selection circuit 28.

In the case where the user writes data to the nonvolatile memory device 10, an address signal, a data signal, and a control signal are input to the nonvolatile memory device from outside. Write processing is thereby executed. In detail, the address input circuit 16 that receives the address signal that is input from outside, and the control circuit 15 that controls the operation of the memory main body unit 22 on the basis of the control signal that is input from outside carry out control with which a write address is selected and a write pulse is applied. The data input/output circuit 6 receives the data signal that is input from outside (in other words, external data), and generates write data on the basis of that external data and sends the write data to the write circuit 14. The write circuit 14 writes that write data to the memory cell corresponding to the selected address.

This write data is data to which parity data for error correction has been added by the data input/output circuit 6. Hereinafter, processing relating to the parity data will be described.

In order to generate write data, the data input/output circuit 6 sends acquired external data to the error correction and parity generation circuit 400 depicted in FIG. 16. The error correction and parity generation circuit 400 calculates parity data (hereinafter, referred to also as an error correction parity) for performing error correction corresponding to the input external data and returns the parity data to the data input/output circuit 6. The data input/output circuit 6 sends write data, in which the external data and the error correction parity are combined, to the write circuit 14. The write circuit 14 writes the write data to a selected memory cell. At such time, the parity data is written to a redundant memory cell that is predetermined in accordance with address information designated from outside.

Furthermore, the address input circuit 16 that receives the address signal and the control circuit 15 that controls the operation of the memory main body unit 22 on the basis of the control signal that is input from outside are used when user data written to the nonvolatile memory device 10 or FHD data is to be read. Specifically, the control circuit 15 controls the read circuit 11 in such a way that a read address is selected on the basis of the address signal that is input to the address input circuit 16 and the selected memory cell is read. Furthermore, the control circuit 15 controls the read circuit 11 in such a way that redundant memory cells predetermined for reading parity data corresponding to an address input from outside are also sequentially selected and read. The read circuit read circuit 11 outputs, from the output terminal A, digital data that is a result of having performed a 1/0 determination in accordance with the threshold value of the input terminal C in the case where user data is to be read or the input terminal B in the case where FHD data is to be read. The data corresponding to the address signal and the parity data corresponding to that data are sent to the error correction and parity generation circuit 400 by way of the data input/output circuit 6, are returned to the data input/output circuit 6 after having been corrected if there is a data error, and, in addition, are output to outside of the nonvolatile memory device 10.

At such time, the determination threshold value stored in the ID threshold value register 26 corresponds to the first threshold value of FIG. 12, and the determination threshold value stored in the data threshold value register 27 corresponds to the second threshold value of FIG. 12. These determination threshold values are input to the input terminal D of the read circuit 11. The determination threshold value of the input terminal D that is input to the read circuit 11 is selected by the threshold value selection circuit 28. In other words, the threshold value selection circuit 28 selects, as the determination threshold value of the input terminal D, any of the median value that is output from the median value detection circuit 25 and input from the input terminal A, the first threshold value that is output from the ID threshold value register 26 and input from the input terminal B, or the second threshold value that is output from the data threshold value register 27 and input from the input terminal C. It should be noted that, when the median value that is input from the input terminal A and the first threshold value that is input from the input terminal B are used to read the digital ID data, a voltage applied to a memory cell of the sense amplifier described later on is changed. Furthermore, a reference voltage VREF, which is a determination level therefor, and the potential of a load control signal LOAD may also be changed.

Hereinafter, an example in which the parity data is used to correct an error in the digital ID data will be described. Hereinafter, an explanation will be given from the viewpoint of the way in which each constituent element operates. Note that the operation of each constituent element is controlled by means of instructions from the control circuit 15.

First, the control circuit 15, at the time of an inspection process prior to factory dispatch, uses the read circuit 11 and the median value detection circuit 25 to generate digital ID data in advance. The error correction and parity generation circuit 400 generates parity data on the basis of that digital ID data. The generated parity data is recorded as user data within a nonvolatile memory cell of a predetermined address, for example.

Next, the operation of the nonvolatile memory device 10 when used in the field will be described. The parity data is recorded in advance as user data at the time of an inspection, and is therefore determined using the first threshold value of FIG. 12. In other words, the read circuit 11 reads the digital ID data by means of the aforementioned process, and outputs the digital ID data to the data input/output circuit 6. Thereafter, the read circuit 11 switches the threshold value to a predetermined value, reads parity data saved in a redundant memory cell corresponding to the digital ID data, and outputs the parity data to the data input/output circuit 6. The data input/output circuit 6 transmits the digital ID data and the parity data to the error correction and parity generation circuit 400. The error correction and parity generation circuit 400 returns the data after having corrected errors, to the data input/output circuit 6. The data input/output circuit 6 outputs that data to outside of the nonvolatile memory device 10.

It should be noted that, in the aforementioned, an explanation has been given in which errors in both the user data and the digital ID data are corrected by the same error correction and parity generation circuit 400; however, this is an example. An error correction and parity generation circuit for correcting errors in digital ID data may be provided outside of the nonvolatile memory device 10, for example. If this kind of configuration is implemented, there is an advantage in that digital ID data sent outside of the nonvolatile memory device 10 includes data errors, and security can be improved with respect to threats such as hacking in communication channels outside of the nonvolatile memory device 10.

As depicted in FIG. 16, the memory main body unit 22 has a user data region 7 and a digital ID data region 8 as storage regions. The user data region 7 is an example of the first memory group that includes a plurality of memory cells in the variable state. Arbitrary data of the user (in other words, user data) is stored in the user data region 7. That is, data is recorded in the first memory group using the first resistance state in the variable state and the second resistance state having a higher resistance value than that of the first resistance state. The address of the user data region 7 is selected when writing and reading user data.

The digital ID data region 8 is an example of the second memory group in which at least one memory cell in the initial state is included. Digital ID data is stored in the digital ID data region 8. In the explanation hereinafter, the digital ID data stored in the digital ID data region 8 is referred to as PUF data constituting an example of the first security data, or FHD data constituting an example of the second security data, in accordance with use. In the case where PUF data is stored in the digital ID data region 8, half or more of the memory cells from within the digital ID data region 8 are in the same initial state without having been subjected to forming processing. However, in the case where FHD data is stored in the digital ID data region 8, forming processing is executed with respect to memory cells to which one type of the recorded binary data has been assigned. The resistance values of the memory cells assigned to the one type of data are thereby set to the first resistance value range of FIG. 12 (in other words, the resistance value range of the HR state). Forming processing is not carried out with respect to the memory cells assigned to the other type of data, and the initial state is maintained. That is, data (second security data) is recorded in the second memory group using the variable state and the initial state.

It should be noted that both PUF and FHD data may be recorded within the same memory cell array 20 by additionally dividing the digital ID data region 8. In other words, PUF data and FHD data may be mixed within the digital ID data region 8. That is, the first security data and the second security data may be recorded in the second memory group in a mixed state.

In addition, third security data encrypted using the first security data (for example, used as a key) may be recorded in the second memory group. For example, a private key encrypted using PUF data as a key may be recorded in the second memory group as FHD data constituting third security data.

Furthermore, the user data region 7 and the digital ID data region 8 do not have to be divided in word line units as in the diagram, and may be demarcated using any of the regions in the memory cell array 20. Resistance against attacks such as hacking can be increased as the degree to which the regularity of physical region divisions is made more complex.

The memory cell array 20 is provided with a plurality of word lines WL0, WL1, WL2, . . . WLm-k-1, WLm-k, . . . WLm, a plurality of bit lines BL0, BL1, . . . BLn, and a plurality of source lines SL0, SL1, SL2, . . . SLn. The user data region 7 and the digital ID data region 8 are divided in units corresponding to word lines. The user data region 7 corresponds to the word lines WL0, WL1, WL2, . . . WLm-k-1, and the digital ID data region 8 corresponds to the word lines WLm-k, . . . WLm The plurality of word lines WL0 to WLm are formed in such a way as to extend in a parallel manner to each other. The plurality of bit lines BL0 to BLn are formed in such a way as to intersect with the plurality of word lines WL0 to WLm, and to extend in a parallel manner to each other. The plurality of source lines SL0 to SLn are formed in such a way as to intersect with the plurality of word lines WL0 to WLm, and to extend in a parallel manner to each other. The plurality of source lines SL0 to SLn and the plurality of bit lines BL0 to BLn are parallel. A memory cell 21 is arranged at each solid intersection point between the plurality of word lines WL0 to WLm and the plurality of bit lines BL0 to BLn.

Each of the memory cells 21 is provided with the resistance-variable element 23 and the transistor 24. The word lines WL0 to WLm are connected to the gate terminals of these transistors 24. The bit lines BL0 to BLn are connected to second electrodes of the resistance-variable elements 23 provided in these memory cells 21. In each of the memory cells 21, a first electrode of the resistance-variable element is connected to a second main terminal of the transistor 24. The source lines SL0 to SLn are connected to first main terminals of these transistors 24.

The resistance-variable elements 23 operate as nonvolatile memory elements in the memory cells 21. The nonvolatile memory device 10 is a so-called 1T1R nonvolatile resistive memory device, in which each memory cell 21 is configured of one transistor 24 and one resistance-variable element 23. Selection elements for the memory cells are not restricted to the aforementioned transistor. For example, a two-terminal element such as a diode may be used.

On the basis of the control signal, the control circuit 15 causes the column decoder circuit 17 to select either a bit line or a source line, and to be connected to the write circuit 14 at the time of a write and the read circuit 11 at the time of a read. Thereafter, the write circuit 14 or the read circuit 11 is made to operate.

The resistance-variable elements 23 are able to have a similar configuration to that of the resistance-variable element 23 depicted in FIG. 1 in the embodiment, and a detailed explanation is therefore omitted.

In the example depicted in FIG. 16, an NMOS transistor is used as a selection transistor for the memory cell array 20; however, it should be noted that there is no restriction thereto, and a PMOS transistor may be used.

Figure 17:
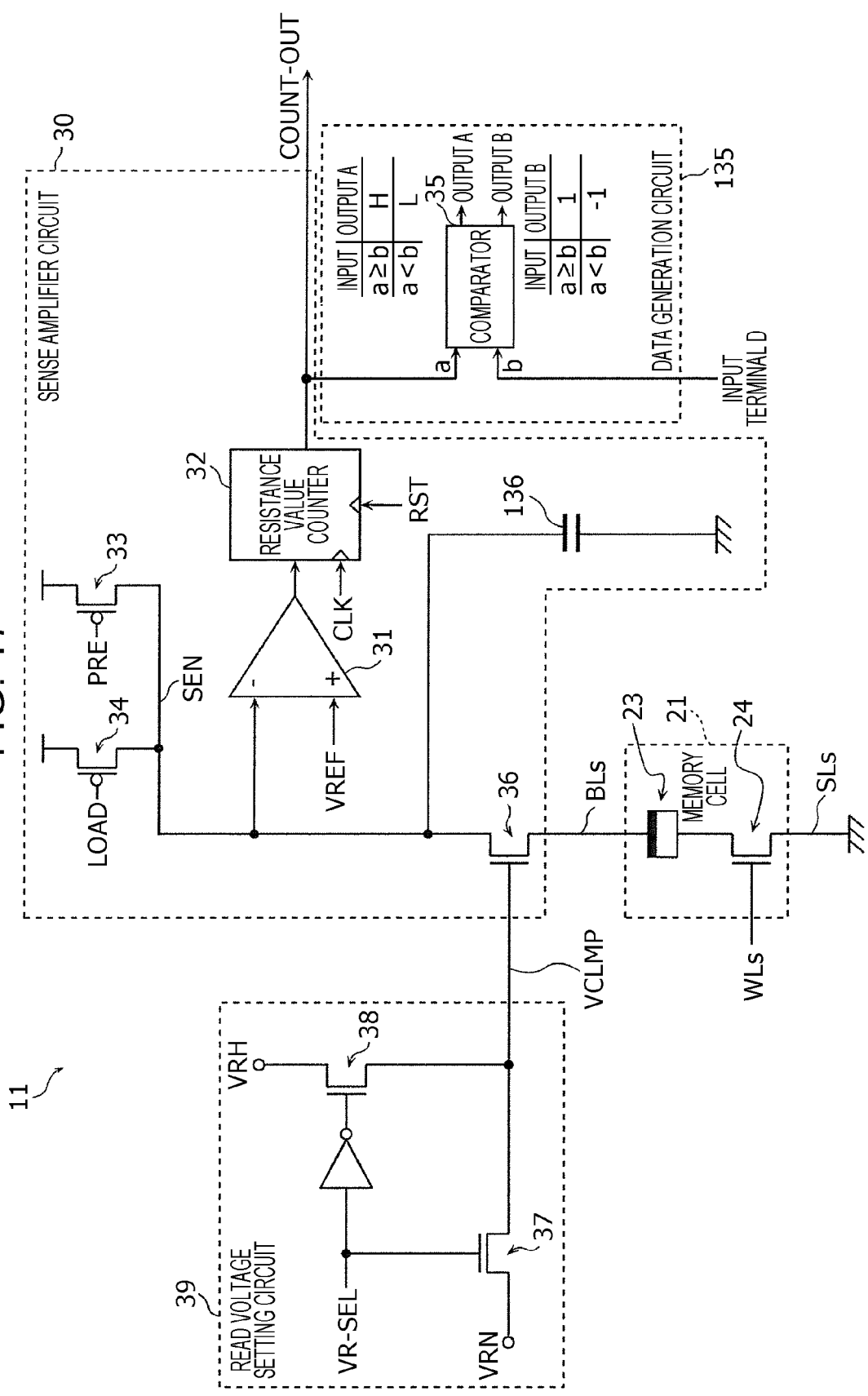
FIG. 17 is a circuit diagram depicting a configuration example of a read circuit provided in the nonvolatile memory device of the present disclosure.

FIG. 17 is a circuit diagram depicting a configuration example of the read circuit 11 provided in the nonvolatile memory device 10 of the present disclosure. It should be noted that a memory cell 21 connected to a sense amplifier circuit 30 is also depicted in the present diagram.

The read circuit 11 has a discharge-type of sense amplifier circuit 30, a read voltage setting circuit 39, and a data generation circuit 135. The sense amplifier circuit 30 is an example of a circuit that reads resistance value information from a memory cell. In the present embodiment, the sense amplifier circuit 30 is provided with a comparator 31, a resistance value counter 32, a precharge PMOS transistor 33, a load-current PMOS transistor 34, and a capacitor 136. The read voltage setting circuit 39 is an example of a circuit that outputs one read voltage from among a plurality of read voltages that include a first read voltage and a second read voltage, to a memory cell when resistance value information is to be read by the sense amplifier circuit 30. In the present embodiment, the read voltage setting circuit 39 is provided with a user data region reading NMOS transistor 37 and a digital ID data region reading NMOS transistor 38. The data generation circuit 135 is an example of a circuit that generates digital data from resistance value information read by the sense amplifier circuit 30, and is provided with a comparator 35 in the present embodiment.

The resistance value counter 32 is connected to the output of the comparator 31. As a result of a reset signal RST becoming low-level, the resistance value counter 32 starts counting by means of a clock signal CLK after a count value within the resistance value counter 32 has been initialized. The clock signal CLK is a signal that is output from the control circuit 15, and is a signal that serves as a reference for when a discharge time that changes depending on the resistance value of the resistance-variable element 23 is converted into a count value. The clock signal CLK is a square wave that maintains a fixed frequency, for example. Each time this clock signal CLK rises, the count value of the resistance value counter 32 has 1 added thereto. The counting up of the resistance value counter 32 stops when the potential of a node SEN falls below the reference voltage VREF, and the count value at that time is maintained in COUNT_OUT. At such time, a threshold value is input from the input terminal D.

The comparator 35 constituting the data generation circuit 135 compares COUNT_OUT and the threshold value that has been input to the input terminal D by way of the input terminal A, B, or C of the threshold value selection circuit 28, outputs H if COUNT_OUT is equal to or greater than the threshold value, and outputs L if COUNT_OUT is less than the threshold value, as output A from the output terminal A. The comparator 35 thereby outputs digital data of 0/1. Furthermore, the comparator 35 compares COUNT_OUT and the threshold value that has been input to the input terminal D by way of the input terminal A of the threshold value selection circuit 28, outputs 1 if COUNT_OUT is equal to or greater than the threshold value, and outputs −1 if COUNT_OUT is less than the threshold value, as output B from the output terminal B. In the precharge PMOS transistor 33, a precharge control signal PRE is input to the gate terminal, a power source voltage VDD is input to the source terminal, and the node SEN is connected to the drain terminal. In the load-current PMOS transistor 34, the load control signal LOAD is input to the gate terminal, the power source voltage VDD is input to the source terminal, and the node SEN is connected to the drain terminal.

In a clamp NMOS transistor 36, a VCLMP node is connected to the gate, the node SEN is connected to either one of the source terminal or the drain terminal, and the memory cell 21 selected by way of the column decoder circuit 17 is connected to the other. It should be noted that depiction of the column decoder circuit 17 is omitted in FIG. 17.

In the user data region reading NMOS transistor 37, a read voltage selection signal VR_SEL is connected to the gate, the VCLMP node is connected to either one of the source terminal or the drain terminal, and a user data region read power source VRN terminal is connected to the other.

In the digital ID data region reading NMOS transistor 38, a signal for which the logic of the read voltage selection signal VR_SEL is inverted is input to the gate, the VCLMP node is connected to either one of the source terminal or the drain terminal, and a digital ID data region read power source VRH terminal is connected to the other.

Figure 18:
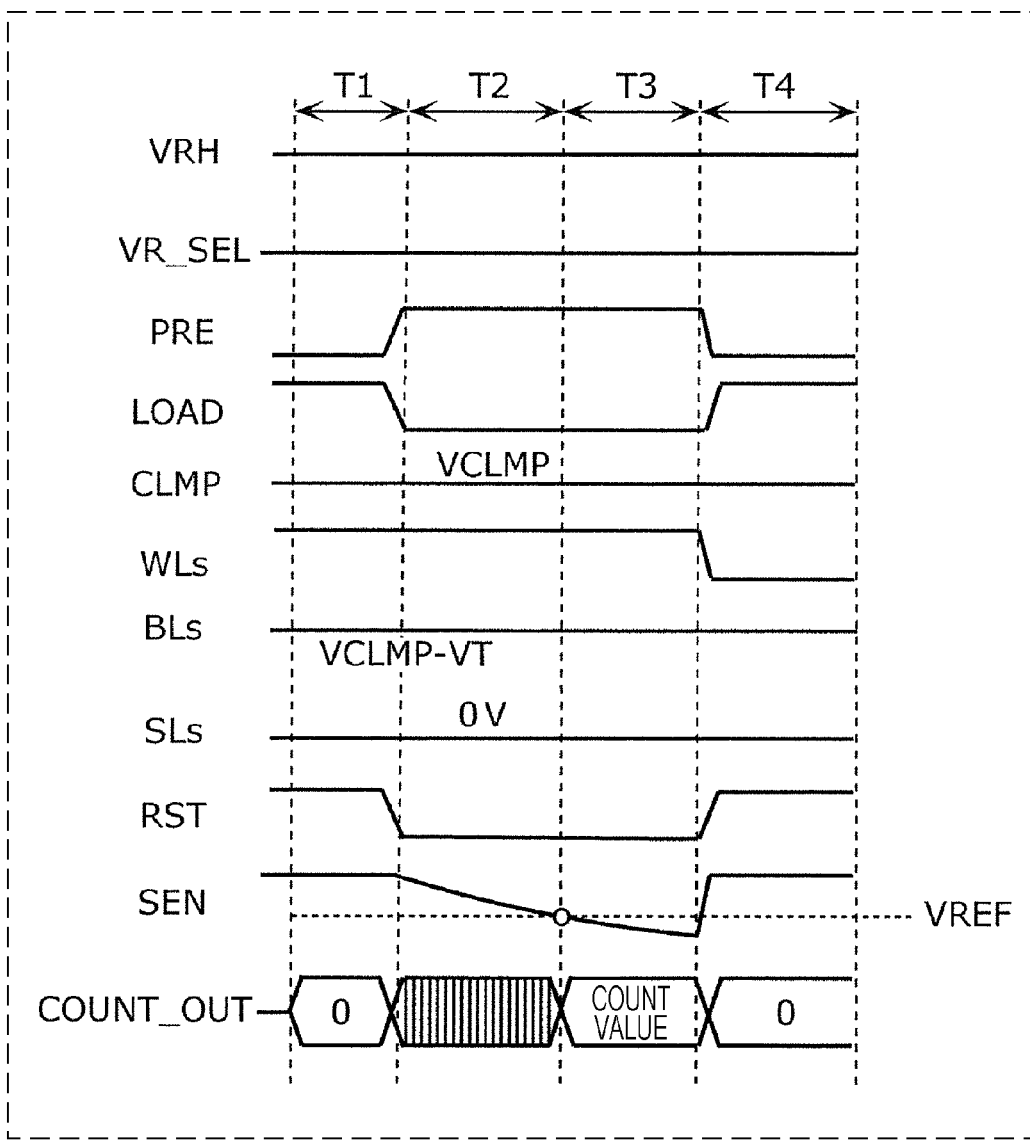
FIG. 18 is a timing chart for the case where a selected memory cell is read by the read circuit by means of a discharging method.

Here, the operation in which the read circuit 11 outputs a count value (an example of a resistance count value) that is resistance value information when data of the digital ID data region 8 is read will be specifically described using the read circuit configuration diagram of FIG. 17 and the timing chart of FIG. 18.

FIG. 18 is a timing chart for the case where a selected memory cell is read by the read circuit 11 by means of a discharging method.

In precharge period T1, because VR_SEL is set to low-level, VCLMP is fixed at VRH. The precharge control signal PRE is low-level and the precharge PMOS transistor 33 is in an on state, whereas the load control signal LOAD is high-level and the load-current PMOS transistor 34 is in an off state. The potential of a selection word line WLs is high-level and the transistors 24 are in an on state.

The VCLMP voltage is applied to the gate terminal of the clamp NMOS transistor 36, and therefore the potential of a selection bit line BLs is precharged up to a potential obtained by subtracting VT (threshold value of the clamp NMOS transistor 36) from VCLMP. A selection source line SLs is fixed to GND. The node SEN is precharged up to the power source voltage VDD. Furthermore, the reset signal RST for the resistance value counter 32 connected to the output of the comparator 31 is high-level, and therefore a fixed value of 0 is output for the output terminal COUNT_OUT of the resistance value counter 32.

In sensing period T2, the precharge control signal PRE is made high-level, and therefore the precharge PMOS transistor 33 enters an off state and the load control signal LOAD becomes low-level, and therefore the load-current PMOS transistor 34 enters an on state.

A voltage is then applied from the selection bit line BLs to the selection source line SLs by way of the selected memory cell 21, and discharging is started. At the same time as the start of discharging, the reset signal RST for the resistance value counter 32 becomes low-level, and counting is started. Then, at each single count, the potential of the node SEN and the voltage of the reference voltage VREF are compared by the comparator 31, and the count value continues to be added until the potential of the node SEN falls below the reference voltage VREF. The discharge time increases and the count value increases as the resistance value of the resistance-variable elements 23 during reading increases.

The capacitor 136 is connected between the node SEN and GND. It is also possible to adjust the discharge time by adjusting the capacitance of the capacitor 136. If the capacitance of the capacitor 136 is large, the discharge time of the node SEN also increases, and therefore the count value increases. If the capacitance of the capacitor 136 is small, the discharge time of the node SEN decreases, and the count value decreases. The capacitor 136 is effective when there is a desire to improve detection accuracy in a low resistance state in which the discharge time is quick, for example. A count interval is decided by the clock signal CLK, and therefore the operating frequency of the clock signal CLK becomes the resolution of the resistance count value. In the case of a low resistance value, when the discharge time is too short, there is a possibility that counting cannot be performed appropriately at the resolution of the resistance count value. Thus, by adding a capacitance load to the node SEN and delaying the discharge time, it becomes possible to deliberately implement an adjustment to achieve discharge characteristics of a level at which detection is possible at the resolution. In principle, in the case of the discharging method, the discharge time increases as the resistance increases, and accordingly the inclination for discharging changes gradually. Thus, the resolution of resistance value information with respect to the count value improves. That is, the discharging method is an effective method in the case where the acquisition of highly accurate resistance value information is required with respect to a memory cell on the high resistance side such as the initial state.

In latch period T3, after discharging has started, the count value of the resistance value counter 32 when the potential of the node SEN has fallen below the reference voltage VREF is latched. The latched count value is output to COUNT_OUT, and is treated as a count value that expresses the resistance value information of the resistance-variable elements 23.

In reset period T4, when data output has been completed, the potential of the selection word line WLs is made low-level, the transistors 24 of the selected memory cell 21 turns off, and the read operation ends.

Figure 19:
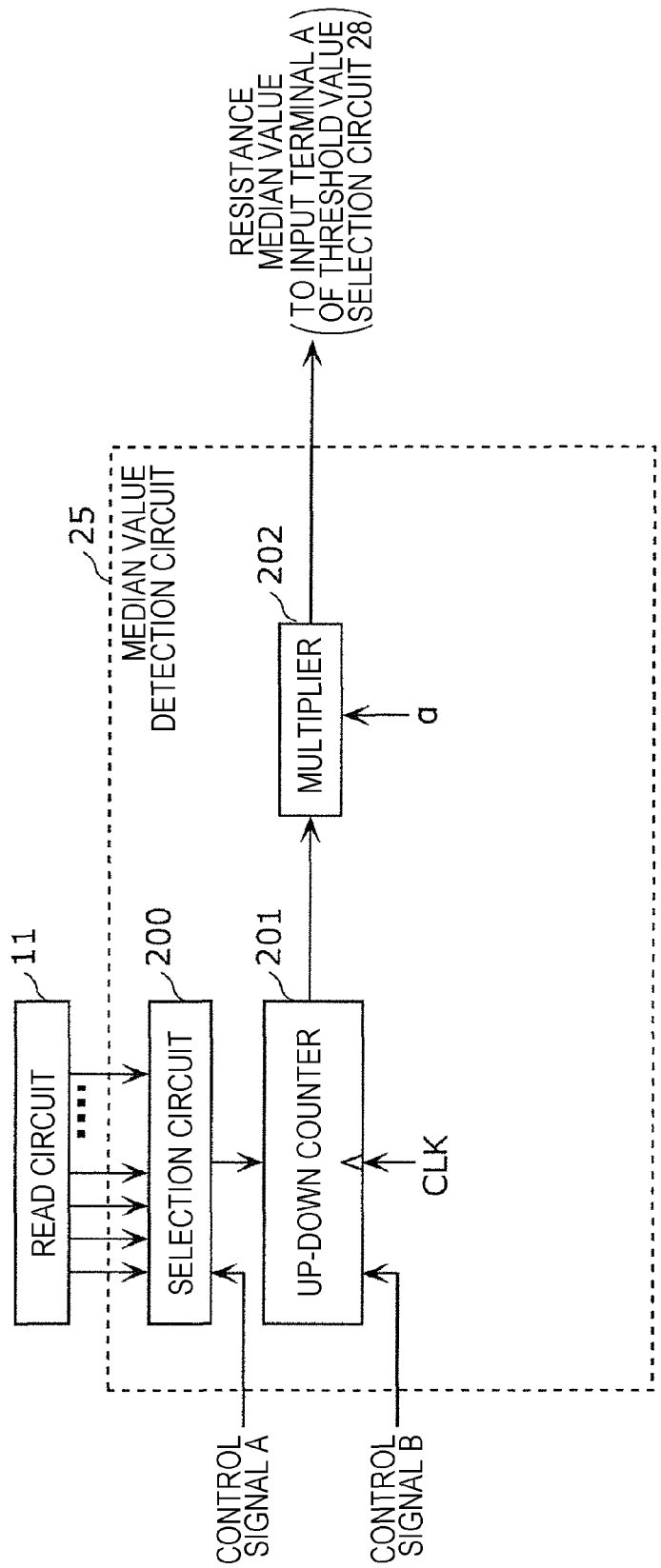
FIG. 19 is a circuit diagram depicting a configuration example of a median value detection circuit provided in the nonvolatile memory device of the present disclosure.

FIG. 19 depicts a configuration example of the median value detection circuit 25 provided in the nonvolatile memory device 10 of the present disclosure.

As depicted in FIG. 19, the median value detection circuit 25 is a circuit that is used when registering or reproducing PUF data, and is provided with a selection circuit 200, an up-down counter 201, and a multiplier 202.

The selection circuit 200 selects input channels for any of the median value error signals that are input from the read circuit 11, in accordance with a control signal A that is input from the control circuit 15. The up-down counter 201 increases/decreases the count value of the median value error signals selected by the selection circuit 200, in accordance with a control signal B indicating logic for the median value error signals. The control signal B is output B that is output from the output terminal B of the comparator 35 in FIG. 17, and indicates a value of "1" or "−1". That is, the up-down counter 201 constitutes a cumulative addition circuit for the median value error signals.

The multiplier 202 multiplies the output of the up-down counter 201 by a predetermined coefficient α and outputs the result. The coefficient α of the multiplier 202 can be set to a value smaller than 1 (for example, ½, ¼, or ⅛). The integration sensitivity of the median value error signals can be changed by changing the coefficient α. It should be noted that "sensitivity" mentioned in the present specification refers to a degree of change or a rate of change. The multiplier 202 can be referred to as a sensitivity adjustment circuit. When the α value is large, sensitivity in the detection of the resistance median value increases, up/down movement in the count value increases, and the detection accuracy for the resistance median value deteriorates. Conversely, when the α value is small, sensitivity decreases and the detection accuracy for the resistance median value increases. However, the number of read times increases, and the time taken for detection increases. The α value is optimally selected according to the system. It should be noted that the detection time can be shortened by setting the initial value for the up-down counter 201 to a value obtained by multiplying a target resistance median value by α.

Describing the aforementioned processing concisely, the up-down counter 201 accumulates, as errors, the differences between resistance value information acquired from selected memory cells and a mid-calculation median value (also referred to as a "provisional median value" in the present specification). The multiplier 202 updates, as a new provisional median value, the value obtained by multiplying the output of the counter by a predetermined coefficient. An appropriate median value can thereby be obtained.

The median value that is output from the multiplier 202 is output to the input terminal A of the threshold value selection circuit 28 as the resistance median value.

It should be noted that the up-down counter 201 constituting a cumulative addition circuit for error signals and the multiplier 202 constituting a sensitivity adjustment circuit that adjusts sensitivity in the accumulation of error signals, such as those depicted in FIG. 19, are merely examples. Furthermore, the configuration of the present disclosure is not restricted to a connection relationship such as the sensitivity adjustment circuit being connected to the output of the cumulative addition circuit. For example, it is possible to also adopt the configuration depicted in FIG. 20.

Figure 20:
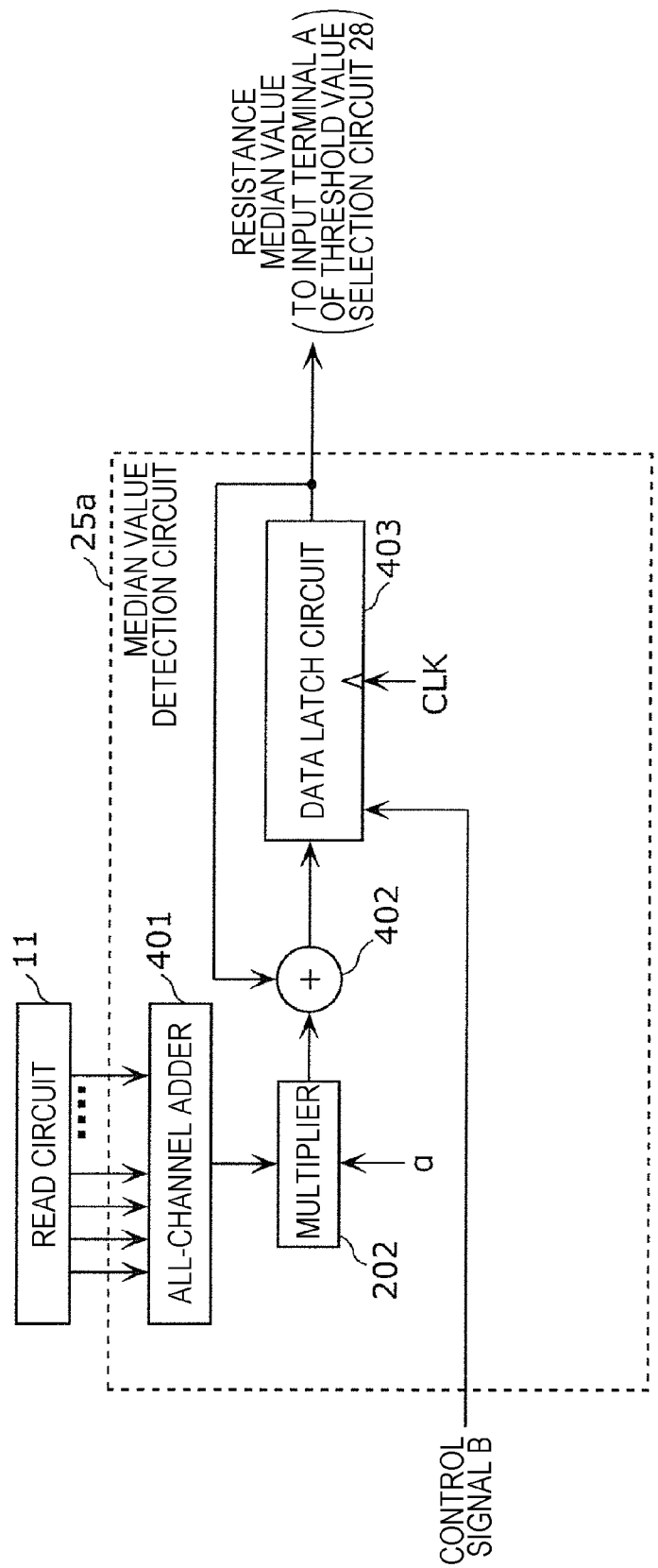
FIG. 20 is a circuit diagram depicting a configuration example of a median value detection circuit according to a modified example.

FIG. 20 depicts a configuration of a median value detection circuit 25a according to a modified example. The median value detection circuit 25a depicted in FIG. 20 is provided with an all-channel adder 401 instead of the selection circuit 200, the multiplier 202, an adder 402, and a data latch circuit 403. The multiplier 202 is connected to the all-channel adder 401, and receives a signal that is output from the all-channel adder 401. The adder 402 is connected to the output of the multiplier 202 and the input and output of the data latch circuit 403. The adder 402 receives and adds the output of the multiplier 202 and the output of the data latch circuit 403, and sends that addition result to the data latch circuit 403.

The data latch circuit 403 receives the output of the adder 402, and latches the received data at a timing designated by the control signal B. It should be noted that the data latch circuit 403 is a circuit that is capable of storing information of a plurality of bits as a result of combining a plurality of 1-bit latch circuits. The number of bits of the data latch circuit 403 is dependent upon the number of bits required as the output thereof. As described next, in the present example, the output of the data latch circuit 403 is used as the resistance median value in the read circuit 11, via the input terminal A of the threshold value selection circuit 28. For the data latch circuit 403, it is sufficient to mount 1-bit latch circuits in a quantity proportionate to the number of bits required in order to express the resistance median value at least.

The operation of this median value detection circuit 25a will be specifically described.

The all-channel adder 401 totals all resistance value error signals of s channels input from the read circuit 11, and outputs the results as a total error signal. The multiplier 202 receives the total error signal and multiplies that signal by the coefficient α. The multiplier 202 adjusts the sensitivity of an error signal by means of the coefficient α. The coefficient α is ½, ¼, or ⅛, for example. The adder 402 adds the output of the data latch circuit 403 and the error signal that is output as a result of the multiplier 202 adjusting the sensitivity, and outputs the result to the data latch circuit 403.

The data latch circuit 403 latches a signal (in other words, data) received from the adder 402, at a timing designated by the control signal B. The data latch circuit 403 sends the data latched immediately prior thereto, to the adder 402 and also to the input terminal A of the threshold value selection circuit 28. This data is used as a resistance median value in the read circuit 11 via the threshold value selection circuit 28.

As is understood from the aforementioned operation, the all-channel adder 401 and the multiplier 202 constitute a sensitivity adjustment circuit that adjusts sensitivity when resistance value error signals are accumulated. Furthermore, the adder 402 and the data latch circuit 403 constitute a cumulative addition circuit that adds and accumulates the immediately preceding resistance median value and a resistance value error signal for which sensitivity has been adjusted, in accordance with a timing designated by the control signal B.

As is clear from the examples of FIGS. 19 and 20, there are various specific circuit configurations and connection relationships that are feasible for provision of the sensitivity adjustment circuit and the cumulative addition circuit for resistance value error signals. When the aforementioned disclosure is taken into consideration, a person skilled in the art could design such a modified example. In light of the gist of the present disclosure, a category of the present disclosure is constituted by one circuit or a combined plurality of circuits that obtain the difference between a resistance median value at the present point in time and resistance value information that has been read, as resistance value error signals, with it being possible to adjust sensitivity when the resistance value error signals are accumulated, and that update the cumulative result of the resistance value error signals as a new resistance median value.

Figure 21:
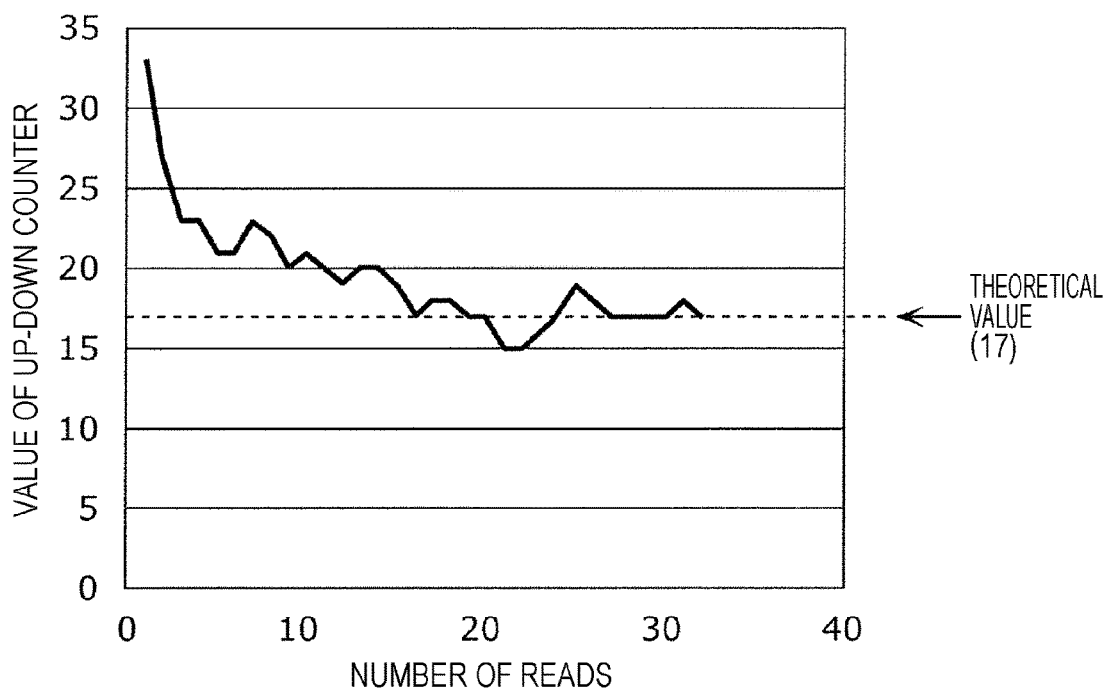
FIG. 21 is a diagram depicting a result of the median value detection circuit having actually calculated a resistance median value.

FIG. 21 depicts a result of the median value detection circuit 25 having actually calculated the resistance median value. The horizontal axis indicates the number of times that the digital ID data region 8 in which PUF data is recorded has been read, and the vertical axis indicates values of the up-down counter. A theoretical value in the case where resistance value information of the digital ID data region 8 is read in advance and the median value is calculated by a computer was 17. As is apparent from the diagram, when the number of read times is around 30, it is clear that there is convergence at 17, which is approximately the theoretical value. In this way, with the method proposed in the present disclosure, the median value of resistance value variations can be detected in a stable manner, and PUF data can be satisfactorily generated using the median value.

In the PUF data reproduction flow depicted in FIG. 13, in step S2, the read circuit 11 of FIG. 17 acquires the resistance value information of memory cells, and in step S3, the median value detection circuit 25 calculates the median value. In step S4, the threshold value selection circuit 28 of FIG. 16 connects the input terminal A from which the calculated median value is output, to the comparator 35 that constitutes the data generation circuit 135 of the read circuit 11. In step S5, the comparator 35 compares the acquired memory cell information and the median value to thereby output digital ID data (that is, PUF data constituting an example of the first security data). Thus, the data generation circuit 135 generates the first security data by mutually comparing resistance value information obtained by the sense amplifier circuit 30, with respect to a plurality of memory cells included in the second memory group. In more detail, the data generation circuit 135 uses a binarization reference value generated by the determination value generation circuit 128, to generate the first security data on the basis of the resistance value information of memory cells within the second memory group.

Meanwhile, in the FHD data reproduction flow depicted in FIG. 15, in step S15, the read circuit 11 reads the resistance value information of a memory cell. In step S16, the threshold value selection circuit 28 of FIG. 16 selects the input terminal B, which is connected to the ID threshold value register 26 in which a resistance value corresponding to the first threshold value (an example of a binarization reference value) of FIG. 12 is stored, and the read circuit 11 compares the first threshold value and the acquired resistance value information. Thus, in step S17, digital ID data (that is, FHD data constituting an example of the second security data) is output.

The aforementioned processing can mainly be realized by means of the control and operation performed by the control circuit 15. The control circuit 15 controls each constituent element in such a way that the aforementioned processing is carried out, and thereby updates each item of digital ID data; more specifically, as follows.

When digital ID data is to be generated, the read circuit 11 acquires resistance value information from each memory cell, after the read voltage setting circuit 39 has set the read voltage to a read voltage that is higher than that when user data is read. In the case where FHD data is to be acquired, the read circuit 11 acquires resistance value information of the first threshold value (an example of a binarization reference value) from the ID threshold value register 26, and outputs digital ID data. Meanwhile, in the case where the read circuit 11 is to acquire PUF data, the median value detection circuit 25 newly calculates a binarization reference value using newly acquired resistance value information. Thereafter, the read circuit 11 acquires resistance value information from a predetermined number of different memory cells that have been newly selected. The control circuit 15 acquires items of resistance value information and information of the newly calculated binarization reference value, and generates individual identification information in accordance with the relationship between these items of information. The resistance value information obtained by the read circuit 11 fluctuates sequentially and relatively according to the ambient temperature, fluctuations in the device power source voltage, and also deterioration over time. As mentioned above, by reacquiring the median value each time resistance value information of the digital ID data region 8 is read, it becomes possible for the median value to be made to follow the optimal value for the present time. When PUF data is read, the median value of a resistance variation distribution that follows an ideal normal distribution is set as a determination threshold value, and therefore a large number of memory cells for PUF data have a resistance value in the vicinity of the determination threshold value. Therefore, by reacquiring the median value in the stable resistance state of the initial state, errors can be reduced even if there are slight distribution changes such as fluctuations in a transistor of a peripheral circuit outside of the memory cells caused by environmental fluctuations or the like. That is, it can be said the method of reacquiring a median value described in the embodiment of the present application is effective in terms of realizing a reduction in PUF errors.

In the PUF data reproduction flow, there is only reference to the method in which the median value is updated each time the median value is reproduced, as indicated in steps S2 and S3; however, it should be noted that the configuration of the present disclosure is not restricted to that method. For example, if the number of error bits generated during reproduction is within a number that can be corrected by the error correction circuit, the previous median value may continue to be used without being updated. Furthermore, the method in which the median value is updated may be used only in the case where the number of error bits generated has exceeded the number that can be corrected by the error correction circuit. In addition, rather than mounting the median value detection circuit, fixed resistance value information in the vicinity of the median value may be used. This resistance value information may be stored in a threshold value register or the like, in a manner similar to the user data and FHD data. When PUF data is to be reproduced, digital ID data may be generated using the resistance value information in the threshold value register.

Figure 22:
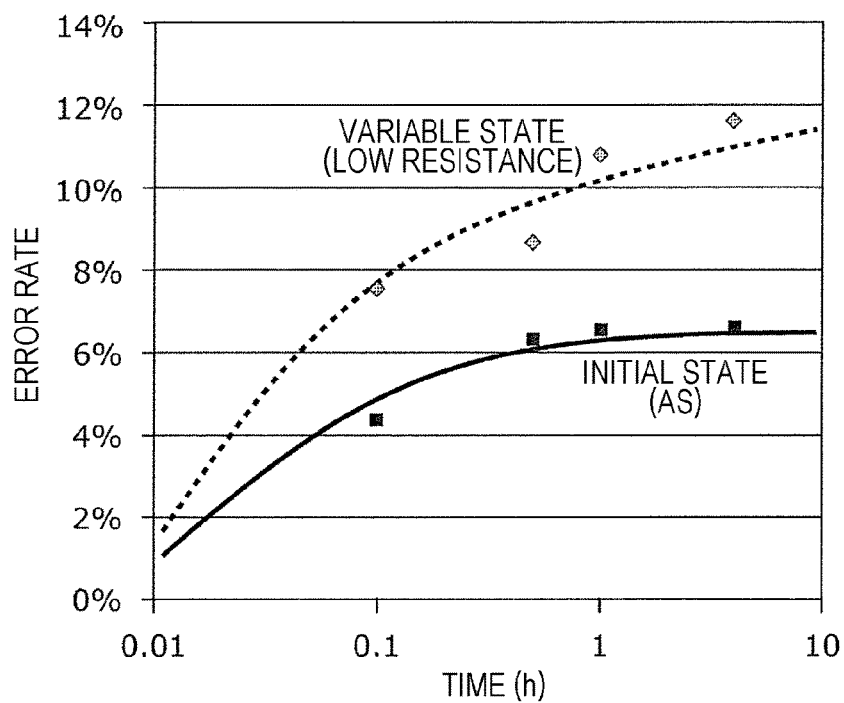
FIG. 22 is a graph depicting error rates when digital ID data is reproduced in a high-temperature accelerated deterioration experiment, for a resistance distribution in the variable state (here, a second resistance state) and a resistance distribution in the initial state.

Next, an effect obtained as a result of the operation of the nonvolatile memory device 10 of the present embodiment will be described. The inventors of the present application left a 4-kilobit memory cell of the digital ID data region 8 for a predetermined time in an environment of 175° C., and carried out a high-temperature accelerated deterioration experiment. FIG. 22 is a graph depicting error rates when digital ID data is reproduced in a high-temperature accelerated deterioration experiment, with regard to the resistance distribution in the second resistance state of the variable state depicted in FIG. 5 and the resistance distribution in the initial state depicted in FIG. 4. In FIG. 22, the horizontal axis indicates the time for which the memory cell is left at a high temperature of 175° C., and the vertical axis indicates the error rate in each reproduction. PUF data reproduced in the second resistance value range that is the variable state had increased errors up to in the vicinity of 12% due to the accelerated deterioration test implemented by leaving the memory cell at high temperature. In contrast, it can be confirmed that high reproducibility with an error rate of approximately 7% is exhibited by PUF data that is reproduced by using the resistance value variation distribution of the stable initial state with a voltage that is higher than normal being applied, and by amplifying up to a current band that can be detected by a circuit.

(Application Example for IC Card)

One application example discloses the encryption of a private key by means of PUF data generated according to the present disclosure, the concealment of data by means of FHD data recording of the encrypted private key, and also an authentication method.

Figure 23:
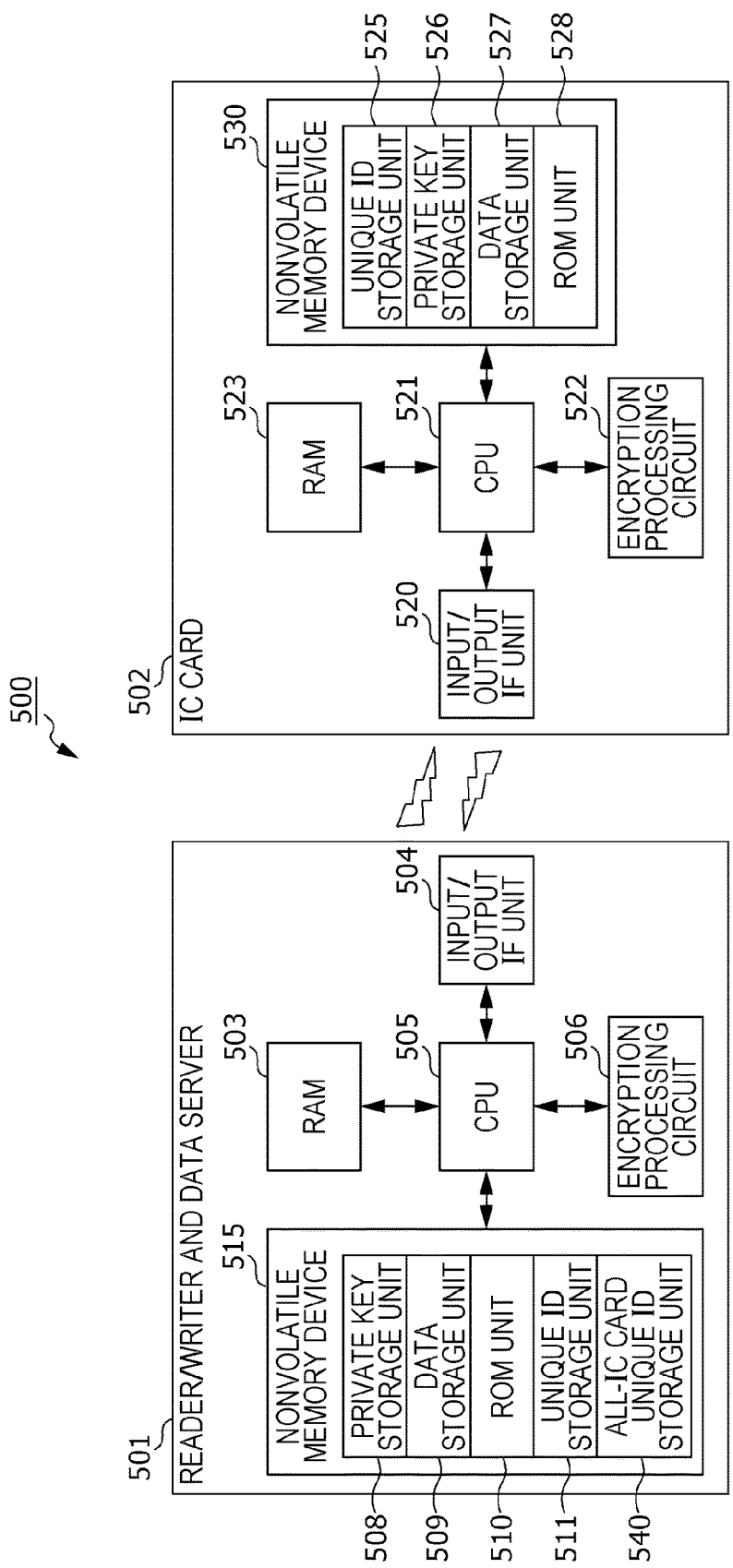
FIG. 23 is a block diagram depicting a configuration example of a communication system in an application example according to the present disclosure.

FIG. 23 is a block diagram depicting a configuration example of a communication system 500 in an application example according to the present disclosure. In FIG. 23, the communication system 500 is provided with a reader/writer and data server 501 (hereinafter, abbreviated to reader/writer) and an IC card 502. The reader/writer 501 and the IC card 502 communicate by means of wireless communication via an antenna or the like provided respectively therein, for example.

(Reader/Writer Side)

The reader/writer 501 has a RAM 503, an input/output interface (IF) unit 504, a CPU 505, an encryption processing circuit 506, and a nonvolatile memory device 515.

The input/output IF unit 504 of the reader/writer 501 is an interface for performing wireless communication with the outside and transmitting and receiving data, and can be realized as a wireless communication circuit, for example. The input/output IF unit 504 has an RF antenna. The input/output IF unit 504 radiates a predetermined electromagnetic wave and uses changes in load to detect whether or not the IC card 502 has been brought close thereto. Furthermore, the input/output IF unit 504, for example, modulates the carrier wave of a predetermined frequency supplied from an oscillation circuit (not depicted), on the basis of data supplied from the CPU 505. The input/output IF unit 504 outputs the generated modulated wave from the antenna (not depicted) as an electromagnetic wave, and thereby transmits various types of data to the IC card 502 positioned nearby. Furthermore, a modulated wave sent from the IC card 502 by way of the antenna is received and demodulated, and the obtained data is supplied to the CPU 505. The nonvolatile memory device 515 corresponds to the aforementioned nonvolatile memory device 10. The nonvolatile memory device 515 is provided with a private key storage unit 508, a data storage unit 509, a ROM unit 510, a unique ID storage unit 511, and an all-IC card unique ID storage unit 540.

The ROM unit 510 corresponds to a predetermined address region from among a second type data storage memory cell group provided in the nonvolatile memory device 515 of the present disclosure. The CPU 505 of the reader/writer 501 loads a program stored in the ROM unit 510 into the RAM 503, and executes various types of processing using the program. Data and the like required for the CPU 505 to execute the various types of processing are also temporarily stored in the RAM 503. A volatile storage device such as a static random access memory (SRAM) or a dynamic random access memory (DRAM) may be used for the RAM 503. Alternatively, the RAM 503 may be configured of a portion of a memory cell group of FHD data of the nonvolatile memory device of the present disclosure.

The unique ID storage unit 511 is a memory cell group used for the generation of PUF data of the present disclosure, and ID data that is unique to the reader/writer 501 can be generated by means of the method of the present disclosure. In addition, the all-IC card unique ID storage unit 540 is configured of a memory cell group in which storing is implemented using PUF data or FHD data, and different digital ID data is all stored using a plurality of IC cards 502 in operation. It should be noted that it is desirable for the digital ID data of all IC cards to be stored as encrypted data with digital ID data that is unique to the reader/writer 501 serving as an encryption key.

The CPU 505 controls the encryption processing circuit 506 to thereby carry out the encryption and decryption of data on the basis of a predetermined encryption algorithm. The Triple Data Encryption Standard (DES), the Advanced Encryption Standard (AES), or the like can be given as an example of an encryption algorithm. These are encryption algorithms of the so-called common key method in which encryption and decryption are carried out using one private key. Furthermore, a public key method such as RSA encryption may be used, in which encrypted communication is carried out by using the two different keys of a private key and a public key and ensuring that the key when encrypting and the key when decrypting are different. In this case, both the public key of the communication partner and the private key of the operator himself or herself may be stored in the private key storage unit 508 described later on. It is desirable for these items of important key data to be encrypted with PUF data of the present disclosure generated from the unique ID storage unit 511 as an encryption key, and stored as an encrypted private key and encrypted public key. As previously mentioned, PUF data generated using PUF technology is unique to the reader/writer 501, and replication and hacking are difficult. Consequently, even if an encrypted private key or encrypted public key that has been encrypted using PUF data is copied, the digital ID data is data that is unique to the input terminal C and cannot be copied and is therefore safe.

In the case where the encryption or decryption of data is carried out in the reader/writer 501, for example, the CPU 505 uses PUF data of the present disclosure as a key to decrypt the encrypted private key stored in the private key storage unit 508, which is a predetermined address region within the nonvolatile memory device 515, and obtains the original private key. The CPU 505 supplies the obtained original private key together with the data to be encrypted or decrypted to the encryption processing circuit 506. The encryption processing circuit 506 executes the encryption or decryption of the data using the supplied private key.

The data storage unit 509 stores data required for the CPU 505 to execute a program. In the data storage unit 509, predetermined data may be encrypted and stored with PUF data of the present disclosure being used as a key. It should be noted that the predetermined data may be stored using a memory cell in the initial state, or may be stored using a memory cell in the variable state.

As the private key storage unit 508, a user data storage memory cell group (that is, a variable state memory cell group) may be used, or a FHD data storage memory cell group (that is, a memory cell group in which the variable state and initial state are mixed) may be used. In the case where the user data storage memory cell group is used, there is no significant difference from another general nonvolatile memory being used. In the case where the FHD data storage memory cell group is used, data is stored using the difference between the initial state and variable state of resistance-variable elements, and therefore data cannot be read with an ordinary read command. Thus, key information can be concealed. As mentioned in the embodiment, determinations for "0" and "1" are carried out using the second threshold value in order to read digital data of "0" and "1" from memory cells in the variable state. When the FHD data storage memory cell group is read using the second threshold value, most of the memory cells are decoded to "0", and normal data cannot be read. It should be noted that, in the private key storage unit 508, it is desirable for the private key to be stored as the aforementioned encrypted private key.

Furthermore, the user data storage memory cell group and the FHD data storage memory cell group can be arranged in a memory cell group of any address within the memory cell array. Thus, even if there is an attempt to perform an analysis such as physically directly reading a resistance value using a probe, it is difficult to specify whether that memory cell belongs to the user data storage memory cell group or the FHD data storage memory cell group. In addition, it is difficult to distinguish between data that has been encrypted using PUF data and unencrypted data, and therefore analysis is made additionally complex.

As mentioned above, it can be said that the communication system 500 depicted in FIG. 23 is highly tamper resistant with respect to the private key being leaked. In addition, the user data storage memory cell and the PUF data of the present disclosure have excellent data reliability at high temperature, and are optimal for the storage and encryption of a private key for which data errors are not allowed.

The private key stored in the private key storage unit 508 may be the same as the private key stored in a private key storage unit 526 of the IC card 502. The private key may be stored in advance only in the reader/writer 501 which corresponds to the IC card 502 and for which the reading of a card unique ID that is digital ID data unique to the IC card 502 is permitted.

The unique PUF data is stored in a state in which data errors are present in a unique ID storage unit 525 on the basis of the PUF technology described in the embodiment of the present disclosure.

The PUF data can be a random number that is unique to each IC card as previously mentioned, and can therefore be used for various types of encryption unique to ICs.

(IC Card Side)

The IC card 502 has an input/output interface (IF) unit 520, a CPU 521, an encryption processing circuit 522, a RAM 523, and a nonvolatile memory device 530.

The input/output IF unit 520 of the IC card 502 is an interface for performing wireless communication with the outside and transmitting and receiving data, and can be realized as a wireless communication circuit, for example. For the input/output IF unit 520, an LC circuit configured of a coil-shaped antenna and capacitor is generally used, for example. The antenna of the IC card resonates with an electromagnetic wave of a predetermined frequency radiated from the reader/writer 501, when the reader/writer 501 is brought close thereto. Furthermore, the input/output IF unit 520 rectifies and stabilizes current that is excited by an alternating-current magnetic field in the antenna, and supplies current to each section of the IC card 502 as a direct-current power source.

The input/output IF unit 520 detects and demodulates a modulated wave received via the antenna, decodes and restores the demodulated data to digital data, and supplies the digital data to the CPU 521. Furthermore, a variable-voltage oscillator (not depicted) is mounted within the IC card 502. This oscillator generates a reception clock signal (not depicted) for which the frequency and phase are locked to the decoded digital data, and supplies this reception clock signal as a data latch clock signal for the digital data. Clock reproduction technology referred to as PLL is used for locking the phase. The IC card 502 detects and integrates a phase difference between the digital data and the clock signal, and generates a control voltage for the oscillator. By inputting this control voltage to the oscillator, it is possible to obtain a clock signal that matches a sampling frequency and phase of the digital data.

In addition, the input/output IF unit 520, when transmitting predetermined information to the reader/writer 501, performs modulation by generating a fluctuation in the load of the antenna in accordance with encoded data that has been input from the CPU 521, and transmits a modulated wave including the predetermined information to the reader/writer 501 via the antenna.

The IC card 502 is provided with the nonvolatile memory device 530 of the present disclosure. The nonvolatile memory device 530 corresponds to the aforementioned nonvolatile memory device 10 of the present embodiment. Thus, in the following explanation, reference is made, as appropriate, to common elements with the same symbols and names appended thereto.

The nonvolatile memory device 530 is provided with the unique ID storage unit 525, the private key storage unit 526, a data storage unit 527, and a ROM unit 528. The unique ID storage unit 525 stores PUF data for each IC card. The private key storage unit 526 stores private key data. The data storage unit 527 stores data required for the CPU 521 to execute a program. The ROM unit 528 stores the program executed by the CPU 521. The unique ID storage unit 525, the private key storage unit 526, the data storage unit 527, and the ROM unit 528 are all included in one memory cell array (the memory cell array 90 of FIG. 9). The CPU 521 carries out various types of processing by loading the program stored in the ROM unit 528 into the RAM 523, executing the program, and the like. Program data stored in the ROM unit 528 may be encrypted and stored using, as a key, PUF data of the present disclosure generated on the basis of a memory cell group in the unique ID storage unit 525.

The CPU 521 controls the encryption processing circuit 522 to thereby carry out the encryption and decryption of data on the basis of a predetermined encryption algorithm. As mentioned above, as typical encryption methods, there are the common key method in which encryption and decryption are carried out using the same private key at the transmitting side and the receiving side, and the public key method in which encryption and decryption are carried out using a public key and a private key that are different. Hereinafter, a case where the common key method is adopted will be described.

It should be noted that, in the public key method, in the case where the IC card 502 transmits encrypted text data that has been encrypted by the IC card 502 side to the reader/writer 501 side, the IC card 502 performs encryption using a public key obtained from the reader/writer 501 side in advance. Conversely, encrypted text data that has been sent from the reader/writer 501 side is decrypted using a private key stored in advance at the IC card 502 side. Other than the aforementioned points, the public key method is the same as the common key method. A public key and private key in the public key method are a mutually unique pair of keys, and therefore, by decrypting mutually encrypted data, mutual authentication can also be carried out at the same time.

In a manner similar to the explanation for the reader/writer 501, in the IC card 502, key data is also stored in the private key storage unit 526. In other words, key data is saved as an encrypted private key or an encrypted public key that has been encrypted by means of PUF data in the unique ID storage unit 525 on the basis of the PUF technology of the present disclosure. In addition, that encrypted private key or encrypted public key can be stored by means of a user data storage memory cell. In the IC card 502, in the case where the encryption or decryption of data is to be carried out, the CPU 521 reads encrypted private key data stored in the private key storage unit 526, which is a portion of the user data storage memory cell group within the nonvolatile memory device 530, by means of a special read command with which reading is performed using the first threshold value of FIG. 12. The encrypted private key data that is read is decrypted into the original private key data by means of PUF data of the present disclosure. The CPU 521 supplies the private key data together with the data to be encrypted or decrypted to the encryption processing circuit 522. The encryption processing circuit 522 executes the encryption or decryption of the supplied data using the supplied private key.

The data storage unit 527 stores data required for the CPU 521 to execute a program. In the data storage unit 527, the predetermined data may be stored as plain text as it is, may be encrypted using the private key and stored, or may be encrypted with PUF data as a key and stored. It should be noted that the predetermined data may be stored using a memory cell in the initial state, or may be stored using a memory cell in the variable state.

A first step of the communication between the IC card 502 and the reader/writer 501 in the communication system 500 provided with this kind of encryption and decryption function is described below.

In the IC card 502, PUF data that is unique to each IC card is present in a state in which data errors are present in the unique ID storage unit 525 on the basis of the PUF technology described in the embodiment of the present disclosure.

The CPU 521 generates PUF data that is unique to each IC card from the unique ID storage unit 525. The CPU 521 supplies the encrypted private key data that has been read and the PUF data that serves as a key to the encryption processing circuit 522. The encryption processing circuit 522 decrypts the encrypted private key into the original private key with the supplied PUF data as a key. Next, the encryption processing circuit 522 encrypts the PUF data using the original private key. Encrypted digital ID data is supplied to the CPU 505 of the reader/writer 501 side via the input/output IF units 520 and 504.

The CPU 505 reads private key data from the private key storage unit 508 of the nonvolatile memory device 515 within the reader/writer 501. The CPU 505 supplies private key data and the received encrypted PUF data to the encryption processing circuit 506. The encryption processing circuit 506 decrypts the encrypted PUF data using the supplied private key data. The decrypted PUF data is compared with each item of ID data stored by the unique ID storage unit 511. If there is an item that matches the decrypted ID data from among the items of ID data, the IC card 502 that has communicated is authenticated as being a normal IC card 502 that is qualified to carry out data communication. Thereafter, data communication is continuously executed.

Another modified example will be given for the mutual authentication between the reader/writer 501 and the IC card 502.

In the all-IC card unique ID storage unit 540 of the reader/writer 501, a plurality of items of PUF data obtained by changing the offset amount for the aforementioned median value are stored for each IC card. The reader/writer 501 encrypts the offset amount and address information of the PUF data that is desired to be received, and transmits this as challenge data to the IC card 502. The IC card 502 decrypts the received challenge data and obtains the offset amount and address information, and encrypts PUF data corresponding to the obtained offset amount and address information. The IC card 502 returns the encrypted PUF data to the reader/writer 501 as response data.

The reader/writer 501 decrypts the received response data, and obtains PUF data that is unique to each IC card 502. The reader/writer 501 searches the ID data registered in the all-IC card unique ID storage unit 540 in advance, on the basis of the obtained PUF data. The reader/writer 501 compares the PUF data and the ID data, and authenticates the IC card 502 by confirming that a predetermined number of bits match.

The PUF data constituting the response data is sent in a state in which error data such as the aforementioned is included, and resistance against hacking is therefore high. The PUF data is a random number that is different in each IC, and therefore, if there is a sufficient Hamming distance between data, even if there is error data of the predetermined number of bits, it is possible to specify to which the IC card the ID data belongs. It is therefore possible to specify that an IC card is a normal card by repeating the transmission of challenge data and the reception of response data. In addition, the data used for authentication is data that is unique to each IC card and has errors, and therefore it is difficult to analyze the data and it is possible to realize authentication in which extremely high security is guaranteed.

As mentioned above, according to the communication system 500, the functions of unique digital ID data generation, private key storage, data storage, and program data storage can be realized with only one nonvolatile memory device. Thus, it is not necessary to separately mount a circuit for generating an ID based upon PUF technology, and it is possible to provide a mobile application such as an IC card in which increases in circuit scale have been suppressed to the utmost extent (that is, area has been saved).

It should be noted that the function of the RAM 503 may be realized with the memory cell array provided in the nonvolatile memory device 515. The function of the RAM 523 may be realized with the memory cell array provided in the nonvolatile memory device 530.

Various types of data can be saved with the user data storage memory cells and the FHD data storage memory cells being mixed in an arbitrary manner as information storage means, and it is therefore possible to conceal from a third party the memory cell area and the state in which information is stored. In addition, PUF data can be defended also from hacking such as directly reading data within a memory using a physical probe, and applications having extremely high tamper-resistance can be provided.

It should be noted that many improvements and other embodiments of the present disclosure will be clear to a person skilled in the art from the aforementioned description. Consequently, the aforementioned description is to be interpreted only as exemplary, and has been provided for the purpose of instructing the best mode for embodying the present disclosure to persons skilled in the art. The details of the structure and/or function of the present disclosure can be substantially altered without deviating from the spirit of the present disclosure.

The nonvolatile memory device according to the present disclosure generates, in a stable and highly secure manner, unique digital ID data that cannot be replicated, from variations in a resistance value of a resistance-variable memory element included within the nonvolatile memory device. Thus, the nonvolatile memory device according to the present disclosure is able to carry out authentication by means of data encryption using digital ID data, and can be mounted in an IC, system on chip (SoC), or the like that accesses a host computer and a server.

What is claimed is:

1. A nonvolatile memory device, comprising:
    a plurality of resistive memory cells each of which takes either a variable state or an initial state, the plurality of resistive memory cells including a memory group including at least one resistive memory cell in the initial state; and
    a read circuit comprising a resistance detection circuit that obtains resistance value information of the plurality of resistive memory cells, and a data generation circuit that generates digital data corresponding to the resistance value information obtained by the resistance detection circuit, wherein
    the resistance detection circuit comprises a voltage application circuit that selectively applies a first read voltage for reading a resistive memory cell in the variable state, and a second read voltage that is larger than the first read voltage and smaller than a voltage of a forming pulse that is an electrical stress for changing from the initial state to the variable state, and
    in order to obtain resistance value information of the at least one resistive memory cell in the initial state, the voltage application circuit applies the second read voltage to the at least one resistive memory cell in the initial state, and after the second read voltage is applied to the at least one resistive memory cell in the initial state, the at least one resistive memory cell maintains the initial state.

2. The nonvolatile memory device according to claim 1, wherein:
    the plurality of resistive memory cells include a first memory group including a plurality of resistive memory cells in the variable state, and the memory group as a second memory group,
    the read circuit further comprises a voltage setting circuit that, in order to obtain the resistance value information of the at least one resistive memory cell in the initial state of the second memory group, sets a voltage that is applied to the at least one resistive memory cell in the initial state of the second memory group by the voltage application circuit to be the second read voltage, and in order to obtain resistance value information of the plurality of resistive memory cells of the first memory group, sets a voltage that is applied to the plurality of resistive memory cells of the first memory group by the voltage application circuit to be the first read voltage,
    in each of the plurality of resistive memory cells in the variable state, a resistance value reversibly transitions between a plurality of variable resistance value ranges when voltage pulses of different polarities are applied, and
    in each of the at least one resistive memory cell in the initial state, a resistance value is in an initial resistance value range that does not overlap with the variable resistance value ranges.

3. The nonvolatile memory device according to claim 1, wherein
    the memory group includes a plurality of resistive memory cells in the initial state.

4. The nonvolatile memory device according to claim 3, wherein
    the data generation circuit generates first security data by mutually comparing resistance value information of the plurality of resistive memory cells included in the memory group.

5. The nonvolatile memory device according to claim 3, further comprising a determination value generation circuit that generates a determination value by using resistance value information of the plurality of resistive memory cells of the memory group, wherein
    the data generation circuit uses the determination value to generate first security data corresponding to the resistance value information of the at least one resistive memory cell in the initial state.

6. The nonvolatile memory device according to claim 5, wherein
the determination value is a binarization reference value.

7. The nonvolatile memory device according to claim 1, wherein
the at least one resistive memory cell in the initial state is half or more of all resistive memory cells included in the memory group.

8. The nonvolatile memory device according to claim 2, wherein
the variable state includes a first resistance state and a second resistance state having a higher resistance value than that of the first resistance state, and
a resistance value in the initial state is higher than the resistance value in the second resistance state.

9. The nonvolatile memory device according to claim 8, wherein
data are recorded in the first memory group by using the first resistance state and the second resistance state, and
second security data are recorded in the second memory group by using the variable state and the initial state.

10. The nonvolatile memory device according to claim 9, wherein
first security data are recorded in the second memory group.

11. The nonvolatile memory device according to claim 9, wherein
third security data that is encrypted using the first security data is recorded in the second memory group.

12. The nonvolatile memory device according to claim 2, wherein each of the at least one resistive memory does not change a state from the initial state to the variable state unless the forming pulse is applied.

13. A nonvolatile memory device, comprising:
a plurality of resistive memory cells each of which takes either a variable state or an initial state, the plurality of resistive memory cells including at least one resistive memory cell in the initial state; and
a read circuit comprising a resistance detection circuit that obtains resistance value information of the at least one resistive memory cell in the initial state, and a data generation circuit that generates digital data corresponding to the resistance value information obtained by the resistance detection circuit, wherein:
the resistance detection circuit applies a second read voltage to the at least one resistive memory cell in the initial state in order to obtain the resistance value information based on the second read voltage, the second read voltage being larger than a first read voltage and smaller than a voltage of a forming pulse that is an electrical stress for changing from the initial state to the variable state, the first read voltage being for reading a resistive memory cell in the variable state, and
after the second read voltage is applied to the at least one resistive memory cell in the initial state, the at least one resistive memory cell maintains the initial state.

* * * * *